(12) United States Patent
Saito

(10) Patent No.: US 7,106,162 B2
(45) Date of Patent: Sep. 12, 2006

(54) CURRENT TRANSFORMER

(75) Inventor: Minoru Saito, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 10/674,072

(22) Filed: Sep. 30, 2003

(65) Prior Publication Data
US 2004/0178875 A1    Sep. 16, 2004

(30) Foreign Application Priority Data
Sep. 30, 2002    (JP)    .............................. 2002-284856

(51) Int. Cl.
*H01F 27/28*    (2006.01)
(52) U.S. Cl. ...................... 336/229; 336/200
(58) Field of Classification Search ................ 336/200, 336/223, 229, 232; 323/117, 127
See application file for complete search history.

(56) References Cited
U.S. PATENT DOCUMENTS

| | | | | |
|---|---|---|---|---|
| 3,668,587 A | * | 6/1972 | Foster | 336/123 |
| 4,803,425 A | * | 2/1989 | Swanberg | 324/173 |
| 5,055,816 A | * | 10/1991 | Altman et al. | 336/200 |
| 5,414,400 A | | 5/1995 | Gris et al. | |
| 6,822,547 B1 | * | 11/2004 | Saito et al. | 336/200 |
| 2003/0090356 A1 | | 5/2003 | Saito et al. | |

FOREIGN PATENT DOCUMENTS

| | | | |
|---|---|---|---|
| JP | 6-176947 A | 6/1994 | |
| JP | 2000-228323 A | 8/2000 | |

* cited by examiner

*Primary Examiner*—Tuyen T Nguyen
(74) *Attorney, Agent, or Firm*—Foley & Lardner LLP

(57) ABSTRACT

A current transformer includes a Rogowski coil, having an opening at the center in which a conductor penetrates, comprising, a printed circuit board having a plurality of layers forming at least first to fourth circuit board surfaces including a circuit board top surface, a circuit board bottom surface and circuit board conducting internal surfaces between the circuit board top surface and the circuit board bottom surface, a plurality of radial metal foils, each metal foil radiating from a center that is approximately the center of the opening, mounted on the first to fourth circuit board surfaces, a first winding formed by electrically connecting metal foils on the first and second circuit board surfaces with first plated through holes penetrating the first and second circuit board surfaces in a thickness direction of the printed circuit board, a second winding formed by electrically connecting metal foils on the third and fourth circuit board surfaces with second plated through holes penetrating the third and fourth circuit board surfaces in a thickness direction of the printed circuit board, a first return circuit line electrically connected with the first winding in series, a second return circuit line electrically connected with the second winding in series, and a pair of the first winding and the first return circuit line and a pair of the second winding and the second return circuit line being electrically connected in series.

32 Claims, 13 Drawing Sheets

CURRENT TRANSFORMER

CROSS-REFERENCE TO RELATED APPLICATIONS

This application is based upon and claims the benefit of priority from the prior Japanese Patent Application No. 2002-284856 filed on Sep. 30, 2002, the entire contents of which are incorporated herein by reference.

BACKGROUND OF THE INVENTION

1. Field of the Invention

This invention relates to a current transformer and current transformer system which are used to measure an alternating current passing in, for example, a main circuit of electric power distribution equipment or substation main circuits equipment, and especially relates to a current transformer and digitalized electronic current transformer system using a Rogowski coil.

2. Description of the Related Art

Generally, a penetrated type current transformer is used in many cases for measuring alternating current passing in electric power distribution equipment, substation main circuit equipment and so on. In a conventional penetrated type current transformer, a secondary winding is wound around a toroidal former, that is a core, and a conductor in which a primary current passes penetrates a centered opening of the core. An iron core, or non-ferromagnetic material is used as the core of this penetrated type current transformer. Among these, a current transformer using a non-ferromagnetic material is called a air core coil type current transformer or a Rogowski coil, which can acquire excellent linearity characteristics without saturation.

FIG. 14 shows the structure of a common Rogowski coil. The Rogowski coil 1 shown in this figure is constituted by a conductor winding 2 coiled from point P to point Q on all over the periphery of the core 6 made of the non-ferromagnetic material, and returning a wire (return circuit line) 3 from point Q to point R in a direction opposite to a winding direction of the winding 2 along the core 6. The return circuit line 3 usually returns between the core 6 and the winding 2. Moreover, a conductor 5 of a main circuit of electric power distribution equipment or substation equipment penetrates an opening 6a of the core 6.

In this situation, voltage is generated proportional to amount of time differential of the primary current flowing in the conductor 5 between terminals 4, 4 of the winding 2 and the return circuit line 3. Accordingly, the above-mentioned primary current can be measured by integrating this voltage and multiplying a constant determined by a form of the coil. For an ideal Rogowski coil, the voltage between terminals 4, 4 is not influenced by a gap of centered points of the core 6 and the conductor 5, and by magnetic field of outside the Rogowski coil 1. An ideal Rogowski coil satisfies the following conditions: (a) a winding interval (pitch) of the winding 2 is constant, (b) an area surrounded by the winding 2 is equal to an area surrounded by the return circuit line 3, (c) cross-sectional area of the core 6 is fixed over the entire circumference and not influenced by temperature, and (d) the winding 2 is completely wound over the entire circumference of the core 6 without any missing portion.

However, when manufacturing the Rogowski coil 1 as shown in FIG. 11, it is technically difficult to satisfy the above-mentioned condition (a), that is, to wind the winding 2 to the core 6 while keeping a constant winding interval. Although a fixed winding interval can be maintained by preparing slots or projections to the core 6 for fixing position of the winding 2, a special core and winding machine is necessary for this preparation, and thus increases the price of the Rogowski coil which becomes very expensive.

In order to solve this disadvantage, a conventional structure of the Rogowski coil shown in FIG. 15 has been constituted. In the Rogowski coil 1 shown in this figure, a metal foil 2e is formed on both sides of a printed circuit board 7 having an opening 9 penetrated by a conductor 5 at a central part so as to coincide with straight lines radially spreading from the center of the opening 9. Moreover, the winding 2 and the return circuit line 3 is constituted so that the radially-arranged metal foils 2e of one side surface of the printed circuit board 7 and the metal foils of a reverse side surface thereof are electrically connected by plated holes which penetrate the printed circuit board 7.

In this example shown in FIG. 15, the return circuit line 3 is formed in the shape of winding, thus, the output voltage between the terminals 4, 4 per unit current and unit frequency becomes large, and sensitivity of the Rogowski coil 1 improves. In addition, winding progress direction of the winding 2 is in a clockwise rotation, and that of the return circuit line 3 is in a counterclockwise rotation. This construction is shown such as a Japanese Patent Disclosure (koukai) No. 6-176947, which is a counterpart of the U.S. Pat. No. 5,414,400. According to such conventional technology, by applying general technique of manufacturing printed circuit boards, the Rogowski coil 1 can be inexpensively manufactured while keeping winding intervals of the winding 2 and the return circuit line 3 constant. Therefore, it becomes possible to realize the condition (a) mentioned above to a remarkable degree. Hereinafter, a Rogowski coil whose windings are constituted by metal foils arranged on the printed circuit board is called as a printed circuit board type Rogowski coil.

By the way, in the conventional Rogowski coil mentioned above, the condition (b), that is, the condition of making an area which the winding 2 surrounds and an area which the return circuit line 3 surrounds equal, cannot be fulfilled completely. This makes it easier for the Rogowski coil to be influenced by an external magnetic field, and this gives rise to an error at the time of current measurement increases.

FIG. 16 is a pattern diagram showing a situation that magnetic flux Φ, due to an external magnetic field in a direction of penetrating an opening 6a at the center of the core 6, interlinks the winding 2 of the common Rogowski coil 1 as shown in FIG. 14. FIG. 17 is a pattern diagram showing a situation that the same magnetic flux Φ due to the external magnetic field interlinks the return circuit line 3 of the common Rogowski coil 1 as shown in FIG. 14.

Since the winding progress direction of the winding 2 is reverse of that of the return circuit line 3, the voltage generated between the terminals 4, 4 of the Rogowski coil 1 shown in FIG. 14 is equal to a difference of the voltage generated between the points P and Q shown in FIG. 16 and the voltage generated between the points P and Q shown in FIG. 14. Assuming that the magnetic flux Φ due to the external magnetic field is uniform all over the surface of the Rogowski coil 1, if the area A, designated by diagonal hatched lines in FIG. 16, which the winding surrounds is not equal to the area B, designated by diagonal hatched lines in FIG. 17, which the return circuit line surrounds, a voltage due to the exterior magnetic field is generated between the terminals 4, 4. Since this voltage is unrelated to the primary current which should originally be measured, it causes a measurement error.

Factors that give rise an external magnetic field are explained below. For example, the external magnetic field is generated when a bend exists in the conductor 5 or when a current flowing conductor 8 exists near the Rogowski coil 1, as shown in FIG. 18, or when the conductor 5 is arranged at an angle to the Rogowski coil 1 as shown in FIG. 19. When applying the Rogowski coil 1 to an actual electric power distribution main circuit equipment or substation main circuit equipment, it is impossible to completely eliminate the above-mentioned factors. In addition, since usually an actual magnetic flux Φ due to the external magnetic field is not uniform, the influence becomes still more complicated.

It is possible to reduce an error by completely making the area A which the winding surrounds and the area B which the return circuit line 3 surrounds equal, more preferably, by arranging the form of the winding 2 and the form of the return circuit line 3 to be completely identical. However, in the common Rogowski coil 1 shown in FIG. 14, it is difficult to manufacture while controlling the area the return circuit line 3 surrounds being constant, thus it is very difficult to avoid the influence of an external magnetic field. On the other hand, though the Rogowski coil shown in FIG. 15 reduces the influence of an external magnetic field considerably, there is still the influence of the external magnetic field because of the constitutional reason that the area the return circuit line 3 is smaller than the area the winding 2 surrounds.

Now, although the influence of the external magnetic field to the Rogowski coil has been explained so far, another problem is explained here. That is, although it has been stated that the influence of the external magnetic field can be considerably reduced by adopting the Rogowski coil as shown in FIG. 15, there is still a problem that the common Rogowski coil shown in FIG. 14 cannot be simply replaced with the Rogowski coil shown in FIG. 15. The reason of the impossibility of the simple replacement of the coils is that, a scale of the secondary output voltage of the Rogowski coil shown in FIG. 15 in terms of the primary current (the scale corresponds to a current transformation ratio in case of an iron core type current transformer) cannot be raised to a level of that of the common Rogowski coil shown in FIG. 14.

As known well, the secondary output voltage of a Rogowski coil is proportional to the product of a number of turns of the coil and a cross-sectional area of one turn coil. As for the common Rogowski coil shown in FIG. 14, the secondary output voltage in terms of the primary rated current is usually several tens of volts per kilo ampere. In the Rogowski coil shown in FIG. 14, since cross section of one turn coil can be decided arbitrarily as long as restrictions of an attachment space allow, and since the number of turns of the coil can be adjusted so that required secondary output voltage may be obtained, by means such as double winding or triple winding, several tens of volts per kilo ampere can be obtained easily as the secondary output voltage. If the several tens of volts per kilo ampere can be obtained as the secondary output voltage from the Rogowski coil, an analog voltage signal can be transmitted without being influenced by noises from the power distribution main circuit equipment or substation main circuit equipment in the field where the Rogowski coil is installed to the main control building of electric power installation where a protection units and control units are affected, that is, without degradation of a signal which effects the protection units and the control units.

However, for the Rogowski coil shown in FIG. 15, there is a physical limit in a number of turns of a coil and a size of cross section of one turn coil in the winding, because of a structural reason that the coil winding is composed of the metal foils formed on the printed circuit board. Although depended on the size of the printed circuit board and the width of the metal foil, a number of turns of a coil is limited to at most one thousand, and the cross section of one turn coil in the winding is restricted due to the fact that the manufacturing limit of thickness of the printed circuit board is at most 5 to 6 millimeters. Thus, the secondary output voltage of the Rogowski coil shown in FIG. 12 is limited at most 100 mV/kA. Though it is assumed that ten sheets of the Rogowski coils are connected in series, the secondary output voltage is about 1 V/kA, and, from a viewpoint on withstanding transmission noise, it is difficult to transmit an accurate analog-voltage signal to a main control building of an electric power installation.

SUMMARY OF THE INVENTION

Accordingly, it is an object of embodiments of this invention to solve problems of the above-mentioned conventional technology, and to provide a current transformer or a current transformer system including a Rogowski coil that prevents the influence of an exterior magnetic field to current measurement, even if an exterior magnetic field exists and penetrates an opening at a center portion of a core, and thus, enables current measurement with high accuracy. Other and further objects of this invention will become apparent upon an understanding of the illustrative embodiments to be described herein or will be indicated in the appended claims while various advantages not referred to herein will be appeared to one skilled in the art upon employment of the invention in practice.

According to one aspect of the invention, there is provided a current transformer, including a Rogowski coil, having an opening at the center in which a conductor penetrates, comprising, (a) a printed circuit board having a plurality of layers forming at least first to fourth circuit board surfaces including a circuit board top surface, a circuit board bottom surface and circuit board conducting internal surfaces between the circuit board top surface and the circuit board bottom surface, (b) a plurality of radial metal foils, each metal foil radiating from a center that is approximately the center of the opening, mounted on the first to fourth circuit board surfaces, (c) a first winding formed by electrically connecting metal foils on the first and second circuit board surfaces with first plated through holes penetrating the first and second circuit board surfaces in a thickness direction of the printed circuit board, (d) a second winding formed by electrically connecting metal foils on the third and fourth circuit board surfaces with second plated through holes penetrating the third and fourth circuit board surfaces in a thickness direction of the printed circuit board, (e) a first return circuit line electrically connected with the first winding in series, (f) a second return circuit line electrically connected with the second winding in series, wherein a pair of the first winding and the first return circuit line and a pair of the second winding and the second return circuit line are electrically connected in series.

According to another aspect of the invention, there is provided a current transformer, including a Rogowski coil, having an opening at the center in which a conductor penetrates, comprising, (a) a printed circuit board having a plurality of layers forming at least 2N+1 circuit board surfaces including a circuit board top surface, a circuit board bottom surface and circuit board internal surfaces between the circuit board top surface and the circuit board bottom surface, N being an integer more than one, (b) N windings, each formed by electrically connecting the radial metal foils on a respective pair of circuit board surfaces with plated thorough holes penetrating the pair of circuit board surfaces in a thickness direction of the printed circuit board, and (c) a return circuit line formed on a circuit board surface, electrically connected with at least one of the N windings in series. And according to still another aspect of the invention, there is provided a current transformer, including a Rogowski coil, having an opening at the center in which a conductor penetrates, comprising, (a) a printed circuit board having a plurality of layers forming at least 2N board surfaces including a circuit board top surface, a circuit board bottom surface and circuit board internal surfaces between the circuit board top surface and the circuit board bottom surface, N being an integer greater than one, and (b) N windings, each formed by electrically connecting the radial metal foils on a respective pair of circuit board surfaces of with plated through holes penetrating the pair of circuit board surfaces in a thickness direction of the printed circuit board, wherein the N windings are connected in series.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE INVENTION

Figure 1:
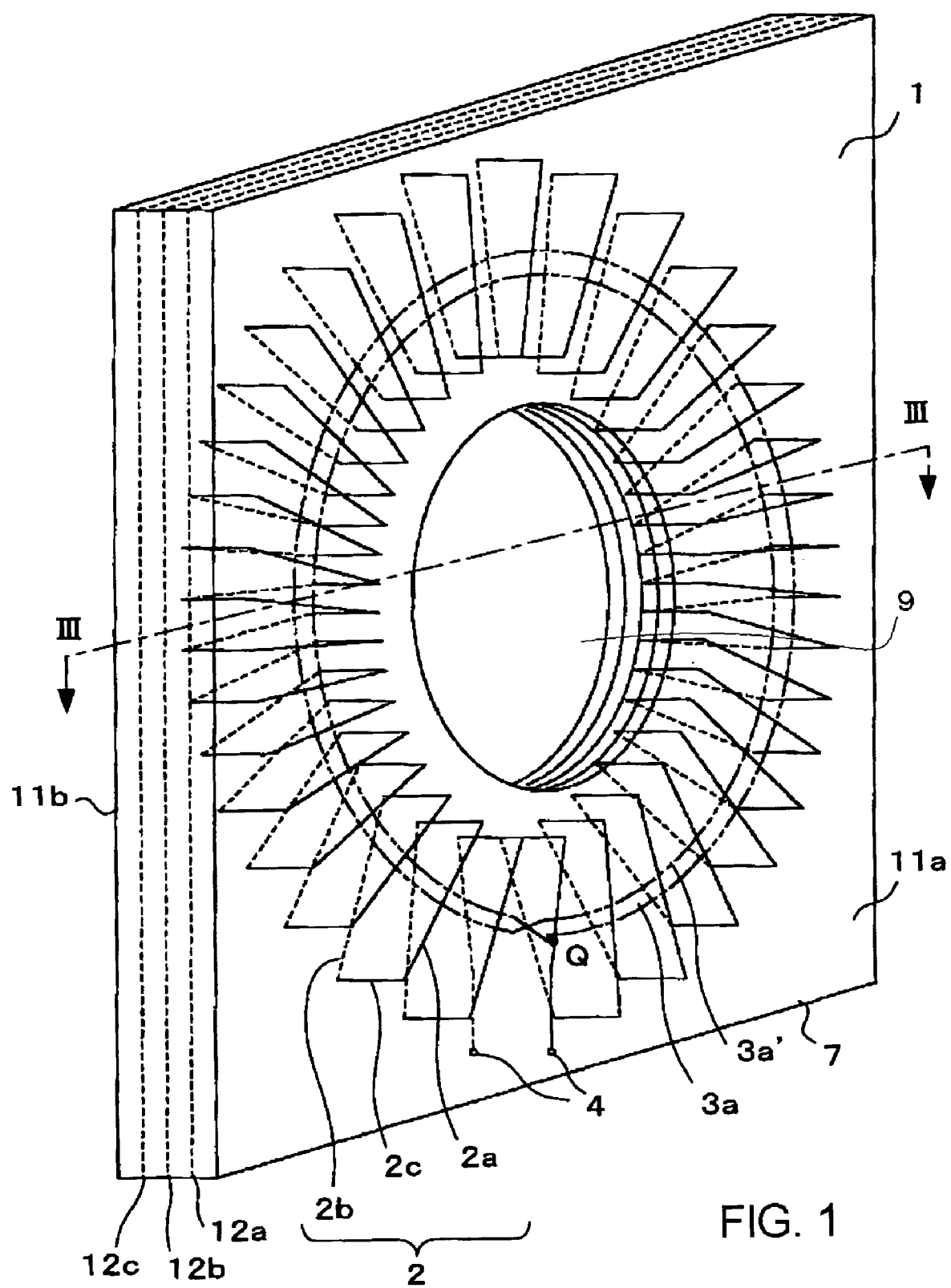
FIG. 1 is an outline perspective view showing a structure of a Rogowski coil of a current transformer in a first embodiment of this invention.

Referring now to the drawings, an embodiment of this invention will be described below.

(First Embodiment)

Figure 2:
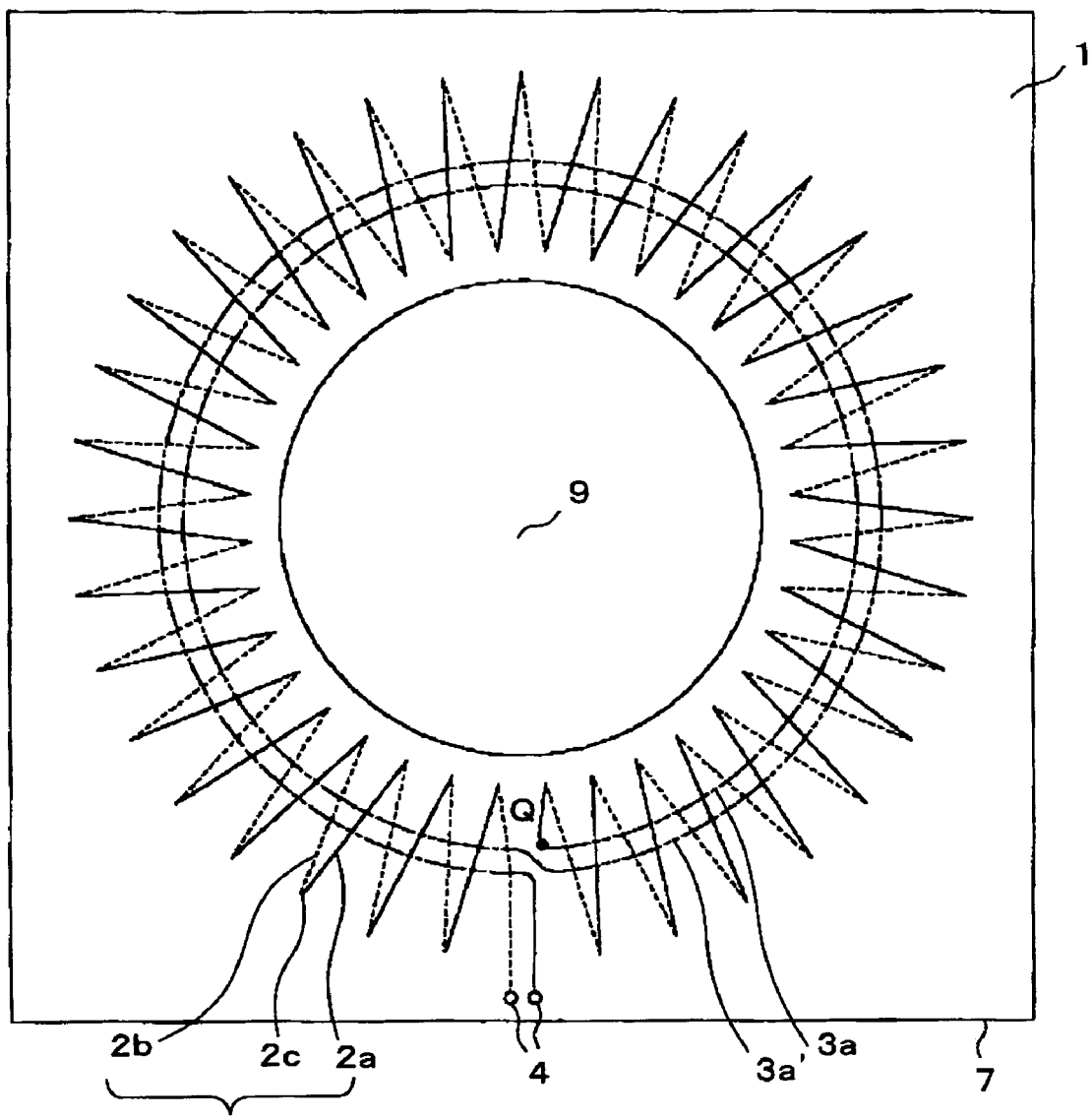
FIG. 2 is an outline front view showing a structure of a printed circuit board of a current transformer in a first embodiment of this invention.
Figure 3:
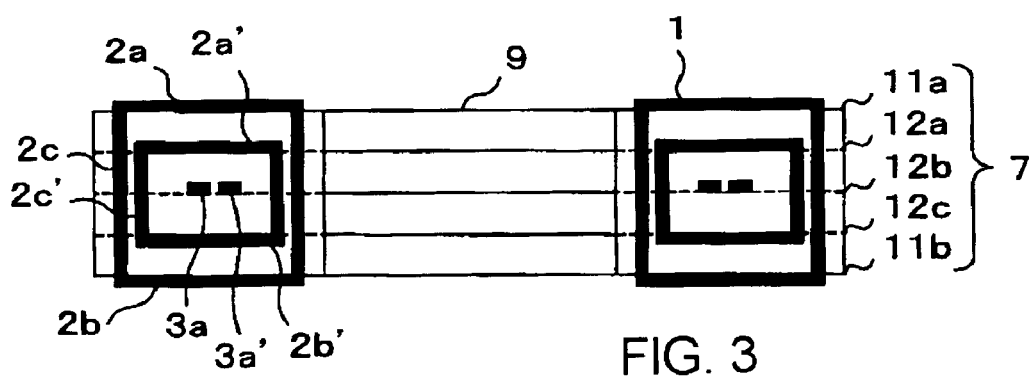
FIG. 3 is a sectional view along with the line III—III in a direction of the arrow shown in FIG. 1.

FIGS. 1, 2 and 3 show a Rogowski coil applied to a current transformer in accordance with a first embodiment of this invention. In this embodiment, firstly, a case forming doubled windings to a printed circuit board of multiple-layer composition with five surfaces is explained. In FIG. 1, a printed circuit board 7 is of multiple-layer composition with five surfaces consisting of a circuit board top surface 11a, a circuit board bottom surface 11b, and three circuit board conducting internal surfaces 12a, 12b, and 12c put between the circuit board top surface 11a and the circuit board bottom surface 11b. The printed circuit board 7 has a circular opening 9, in a center portion, which is penetrated by a conductor (not illustrated) in which alternating current of a main circuit passes.

FIG. 2 is an outline front view of the printed circuit board 7 from a direction of central axis of the opening 9. FIG. 3 is a sectional view along with the line III—III in a direction of the arrow shown in FIG. 1. The Rogowski coil 1 of the current transformer in this embodiment includes radial metal foils 2a on the circuit board top surface 11a (the first surface) in form of a plurality of straight lines radially spreading with a center which is approximately equal to the center of the opening 9, and radial metal foils 2b on the circuit board bottom surface 11b (the fifth surface) in the same form as the radial metal foils 2a. The radial metal foils 2a of the circuit board top surface 11a (the first surface) and the radial metal foils 2b of the circuit board bottom surface 11b (the fifth surface) are electrically connected by a plated through-hole 2c penetrating the printed circuit board 7 in a direction of thickness. The radial metal foils 2a, 2b and the through-hole 2c constitute one winding 2.

Moreover, although not illustrated in FIGS. 1 and 2, as shown in FIG. 3, radial metal foils 2a' are formed on the circuit board conducting internal surface 12a (the second surface) in form of a plurality of straight lines radially spreading with a center which is approximately equal to the center of the opening 9, and radial metal foils 2b are formed on the circuit board conducting internal surface 12c (the fourth surface) in the same form as the radial metal foils 2a'. The radial metal foils 2a of the circuit board conducting internal surface 12a (the second surface) and the radial metal foils 2b of the circuit board conducting internal surface 12c (the fourth surface) are electrically connected by a plated through-hole 2c' penetrating the printed circuit board 7 in a direction of thickness. The radial metal foils 2a', 2b' and the through-hole 2c' constitute one another winding 2', therefore, doubled windings, that is, the winding 2 and the winding 2', are formed in the printed circuit board 7.

And circular metal foils 3a and 3a' are formed on the circuit board conducting internal surface 12b (the third surface), which is about center in a direction of thickness of the printed circuit board 7, and these circular metal foils 3a and 3a' have a center which is approximately equal to the center of the opening 9, and are electrically connected as return circuit lines of the windings 2 and 2', respectively. The windings 2, 2' and the circular metal foils 3a, 3a' are electrically connected in series at the point Q. In FIG. 2, the radial metal foils 2a of the circuit board top surface 11a (the first surface) is shown as solid lines, the radial metal foils 2b of the circuit board top surface 11b (the fifth surface) is shown as dashed lines, the circular metal foils 3a, 3a' are shown as two-dashed lines, meanwhile, the radial metal foils 2a' and 2b' of the circuit board conducting internal surfaces 12a, 12c (the second surface and the fourth surface) are not illustrated.

Figure 4:
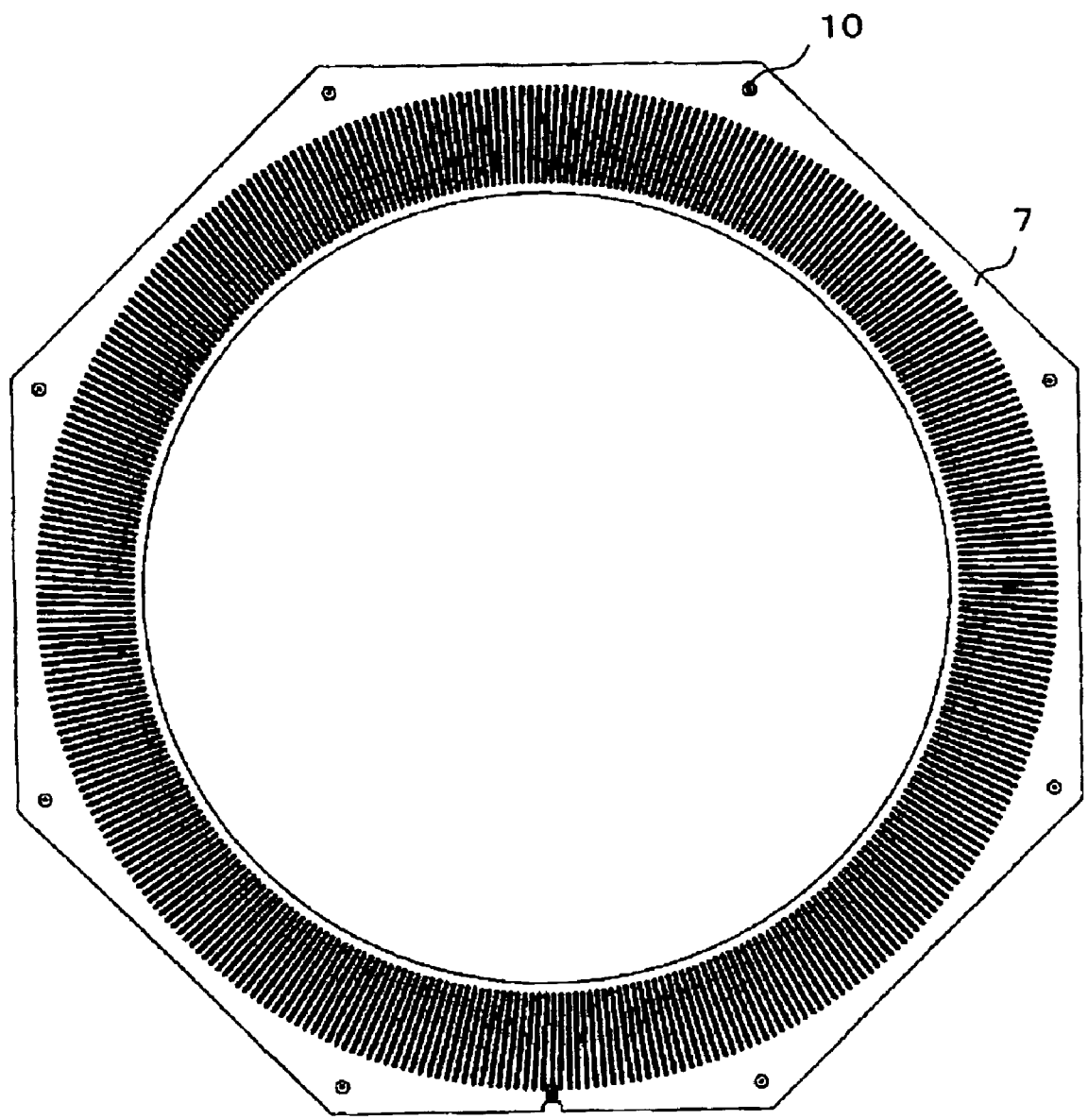
FIG. 4 is a front view showing a concrete example of a printed circuit board in a first embodiment of this invention.

A radius of the circular metal foil 3a of the circuit board conducting internal surface 12b (the third surface) of the printed circuit board 7 is determined so that an area surrounded by the radial metal foil 2a of the circuit board top surface 11a (the first surface) and the radial metal foil 2b of the circuit board top surface 11b (the fifth surface) equals to an area surrounded by the circular metal foil 3a, that is a return circuit line thereof. And a radius of the circular metal foil 3a' of the circuit board conducting internal surface 12b (the third surface) of the printed circuit board 7 is determined so that an area surrounded by the radial metal foil 2a' of the circuit board conducting internal surface 12a (the second surface) and the radial metal foil 2b' of the circuit board conducting internal surface 12b (the fourth surface) equals to an area surrounded by the circular metal foil 3a', that is a return circuit line thereof. In addition, for such a printed circuit board, a general manufacture technique of printed circuit boards makes it possible to manufacture the windings 2, 2' and the circular metal foils 3a, 3a', in sufficiently exact positions. FIG. 4 shows one example of a concrete front view of the Rogowski coil in a form of the printed circuit board 7. An outline of the printed circuit board 7 is constituted as an equilateral octagon, each vertex of which has a drilled hole 10 for attachment.

According to this current transformer in this first embodiment with the above-mentioned composition, following actions and effects are acquired. That is, since the Rogowski coil in a form of the printed circuit board with windings formed by metal foils on/in the printed circuit board enables to have a structure of multiple windings, if it has a size equivalent to that of conventional Rogowski coils in a form of the printed circuit board, it can achieve accuracy of current measurement equivalent to the conventional ones and high secondary output voltage which is a multiple of times as high as that of the conventional ones, wherein this multiple corresponds to the number of the multiple windings. Therefore, this embodiment enables to achieve excellent withstanding noise characteristics compared to the conventional Rogowski coil in a form of the printed circuit board.

Figure 18:
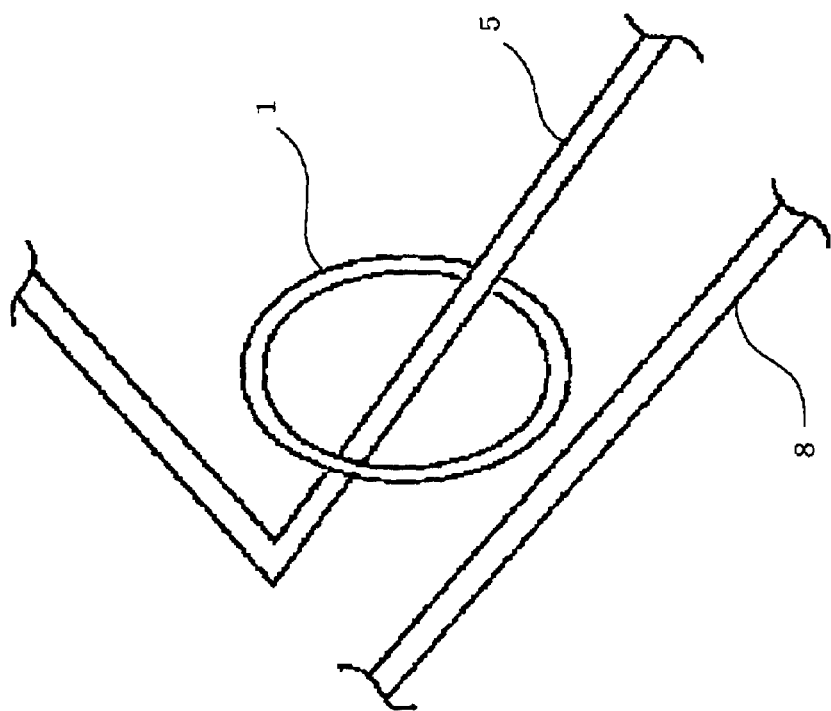
FIG. 18 is a pattern diagram that explains an example of factors that generate an external magnetic field.

In a case that a conductor has a bend portion as shown in FIG. 18, a case that a conductor exists outside the Rogowski coil, or a case that a conductor is arranged slantingly against the Rogowski coil, there exists an external magnetic field penetrating in a direction of the central opening 9 of the printed circuit board 7 owing to arrangement of the Rogowski coil. Even in such cases, influence of the external magnetic field can be reduced by determining the radius of the circular metal foils 3a, 3a' so that total area surrounded by a plurality of windings equals to total area surrounded by a plurality of return circuit lines. That is, even if the external magnetic field penetrating the central opening 9 of the printed circuit board 7 exists, the total area surrounded by the plurality of windings is equivalent to the total area of the plurality of return lines, therefore, a total voltage generated on the plurality of windings and a total voltage generated on the plurality of return circuit lines, owing to a linkage of magnetic flux due to the external magnetic field, have magnitude almost equal to each other and polarities opposite to each other, thus the two voltage are completely offset. Therefore, influence toward current measurement owing to the external magnetic field can be prevented, and thus a current measurement can be realized with high accuracy.

Moreover, since this Rogowski coil in a form of the printed circuit board can be made easily with a uniform and highly-precise winding pitch by general manufacture technique of the printed circuit board, highly precise Rogowski coil can be manufactured in a relatively low price. Especially, when a number of the multiple windings is relatively small, such as doubled-winding structure or threefold-winding structure, that is, a number of the circular metal foils as return circuit lines is also relatively small, such as two or three, if the plurality of the circular metal foils are arranged on one same circuit board conducting internal surface, a number of surfaces of the circuit board can be reduced and thus the printed circuit board can be manufactured more cheaply.

Moreover, by arranging the outside of the printed circuit board as a regular octagon, it can be cheaply manufactured by using a linear shape, and an attachment space of the Rogowski coil can be made small compared with another shape such as a square. Especially, the attachment space of this regular octagon is almost as same as that of a circle which is more expensive in manufacturing the printed circuit board.

In this embodiment, one case of the printed circuit board of multiple-layer composition with five surfaces in which doubled windings are formed is explained, however, similar situations such as threefold windings based on seven surfaces, or fivefold windings, or sixfold windings, and so on, also enable to achieve actions and effects equivalent to those of this first embodiment as mentioned above.

In the above-mentioned first embodiment, the circular metal foils 3a and 3a' are formed on the same circuit board conducting internal surface 12b (the third surface). It is also possible that the printed circuit board 7 is constituted as multiple-layer composition with six surfaces with the circular metal foil 3a formed on the third surface and the another circular metal foil 3a' formed on the fourth surface. In this case, the radial metal foils formed in the fourth surface and the fifth surface in the above-mentioned first embodiment may be formed in the fifth surface and the sixth surface, respectively.

Although modified examples of this first embodiment are explained as above, more multiplexed winding structure such as threefold-winding composition, there are three circular metal foils, each of which can be formed in one of three circuit board conducting internal surfaces, independently. Alternatively, it is also possible that two of the three circular metal foils are formed on one conducting internal surface and another one is formed on another conducting internal surface. This is the same manner in case of more than three multiplexed windings. These modified examples can also be attained actions and effects equivalent to those of the first embodiment as mentioned above, and additionally, they have a merit that total area surrounded by a plurality of return circuit lines can be easily adjusted by forming the circular metal foils as the return circuit lines separated into several groups of conducting internal surfaces, each of which has a part of the circular metal foils, in case of a relatively large number of multiple windings. However, from a viewpoint of downsizing in cost, it is preferable to decrease the number of the conducting internal surfaces constituting the return circuit line as least as possible.

(Second Embodiment)

Figure 5:
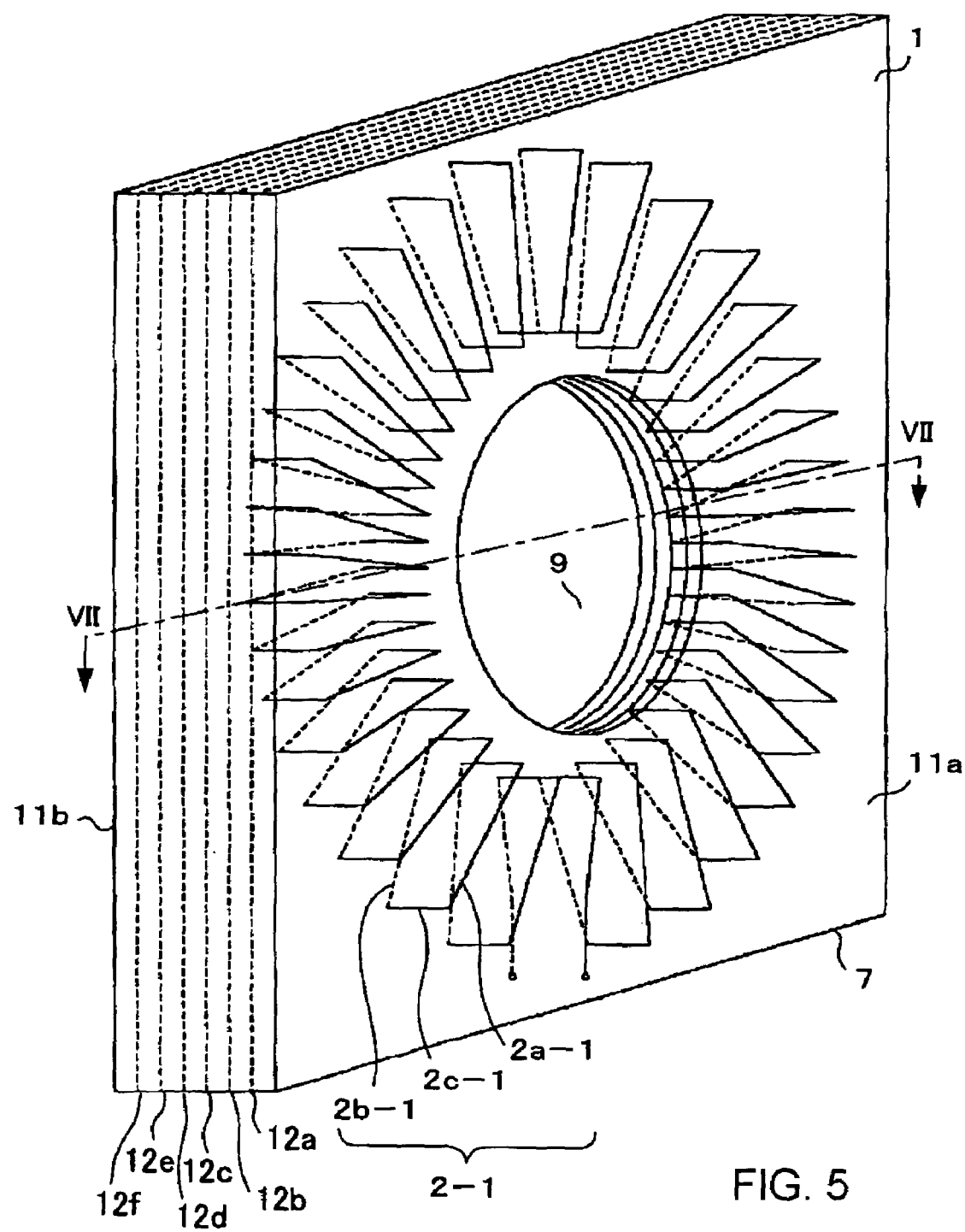
FIG. 5 is an outline perspective view showing a structure of a Rogowski coil of a current transformer in a second embodiment of this invention.
Figure 6:
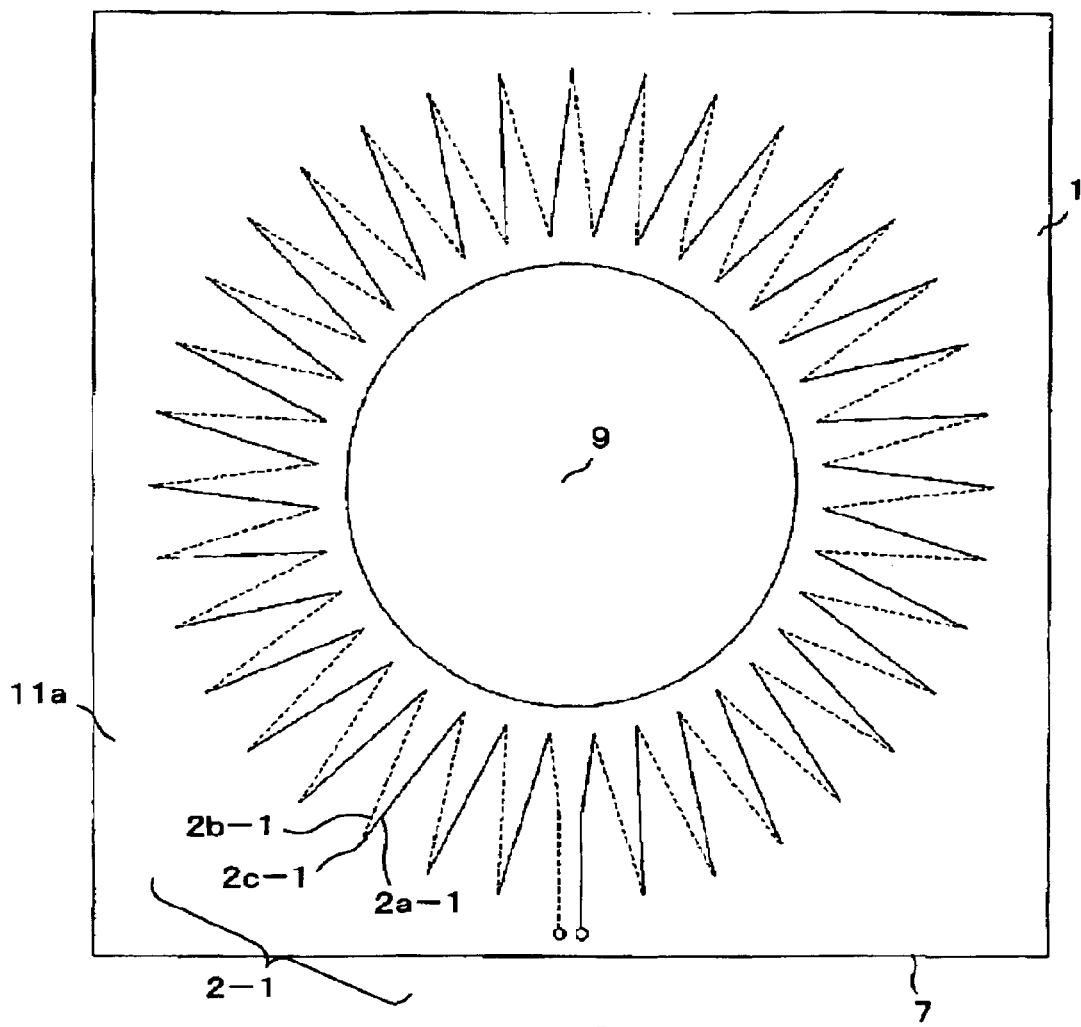
FIG. 6 is an outline front view showing a structure of a printed circuit board of a current transformer in a second embodiment of this invention.
Figure 7:
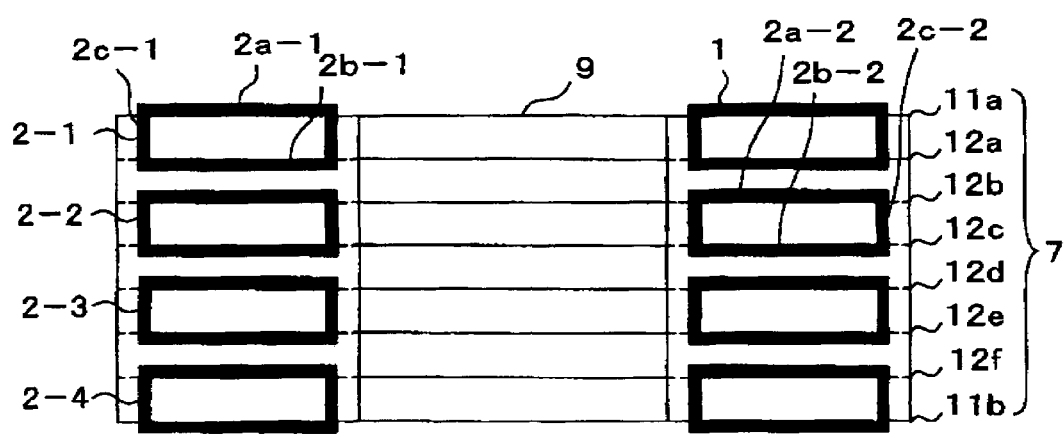
FIG. 7 is a sectional view along with the line VII—VII in a direction of the arrow shown in FIG. 5.

FIGS. 5, 6 and 7 show a Rogowski coil applied to a current transformer in accordance with a second embodiment of this invention. In this embodiment, firstly, a case forming fourfold windings to a printed circuit board of multiple-layer composition with eight surfaces is explained. In FIG. 5, a printed circuit board 7 is of multiple-layer composition with eight surfaces consisting of a circuit board top surface 11a, a circuit board bottom surface 11b, and six circuit board conducting internal surfaces 12a, 12b, 12c, 12d, 12e and 12f put between the circuit board top surface 11a and the circuit board bottom surface 11b. The printed circuit board 7 has a circular opening 9, in a center portion, which is penetrated by a conductor (not illustrated) in which alternating current of a main circuit passes.

FIG. 6 is an outline front view of the printed circuit board 7 from a direction of central axis of the opening 9. FIG. 7 is a sectional view along with the line VII—VII in a direction of the arrow shown in FIG. 5. The Rogowski coil 1 of the current transformer in this embodiment includes radial metal foils 2a-1 on the circuit board top surface 11a (the first surface) in form of a plurality of straight lines radially spreading with a center which is approximately equal to the center of the opening 9, and radial metal foils 2b-1 on the circuit board conducting internal surface 12a (the second surface) in the same form as the radial metal foils 2a-1. The radial metal foils 2a-1 of the circuit board top surface 11a (the first surface) and the radial metal foils 2b-1 of the circuit board conducting internal surface 12a (the second surface) are electrically connected by a plated through-hole 2c-1 penetrating the printed circuit board 7 in a direction of thickness. The radial metal foils 2a-1, 2b-1 and the through-hole 2c-1 constitute a first winding 2-1.

Moreover, although not illustrated in FIGS. 5 and 6, as shown in FIG. 7, radial metal foils 2a-2 are formed on the circuit board conducting internal surface 12b (the third surface) in form of a plurality of straight lines radially spreading with a center which is approximately equal to the center of the opening 9, and radial metal foils 2b-2 are formed on the circuit board conducting internal surface 12c (the fourth surface) in the same form as the radial metal foils 2a-2. The radial metal foils 2a-2 of the circuit board conducting internal surface 12b (the third surface) and the radial metal foils 2b-2 of the circuit board conducting internal surface 12c (the fourth surface) are electrically connected by a plated through-hole 2c-2 penetrating the printed circuit board 7 in a direction of thickness. The radial metal foils 2a-2, 2b-2 and the through-hole 2c-2 constitute a second winding 2-2. Similarly, a third winding 2-3 and a fourth winding 2-4 are formed in a same manner of the first winding 2-1 and the second winding 2-2, thus the printed circuit board 7 has fourfold windings.

In FIG. 6, the radial metal foils 2a-1 of the circuit board top surface 11a (the first surface) is shown as solid lines, the radial metal foils 2b-1 of the circuit board conducting internal surface 12a (the second surface) is shown as dashed lines, meanwhile, the radial metal foils 2a-2, 2b-2, 2a-3, 2b-3, 2a-4 and 2b-4 of the third to eighth surfaces, respectively, are not illustrated. Here, both the winding 2-1 and the winding 2-3 are wound in a clockwise direction in FIG. 6 with the same center as a central axis of the opening 9. On the other hand, both the winding 2-2 and the winding 2-4 are wound in a counterclockwise direction in FIG. 6 with the same center as a central axis of the opening 9. The windings 2-1, 2-2, 2-3 and 2-4 are electrically connected in series. Moreover, each winding is composed so that the total area surrounded by the winding 2-1 and the winding 2-3 is equivalent to total area surrounded by the winding 2-2 and the winding 2-4.

According to this current transformer in this second embodiment with the above-mentioned composition, following actions and effects are acquired. That is, since the Rogowski coil in a form of the printed circuit board with windings formed by metal foils on/in the printed circuit board enables to have a structure of multiple windings, if it has a size equivalent to that of conventional Rogowski coils in a form of the printed circuit board, it can achieve equivalent accuracy of current measurement to the conventional ones and high secondary output voltage which is a multiple of times as high as that of the conventional ones, wherein this multiple corresponds to the number of the multiple windings. Therefore, this embodiment enables to achieve excellent withstanding noise characteristics compared to the conventional Rogowski coil in a form of the printed circuit board.

Figure 14:
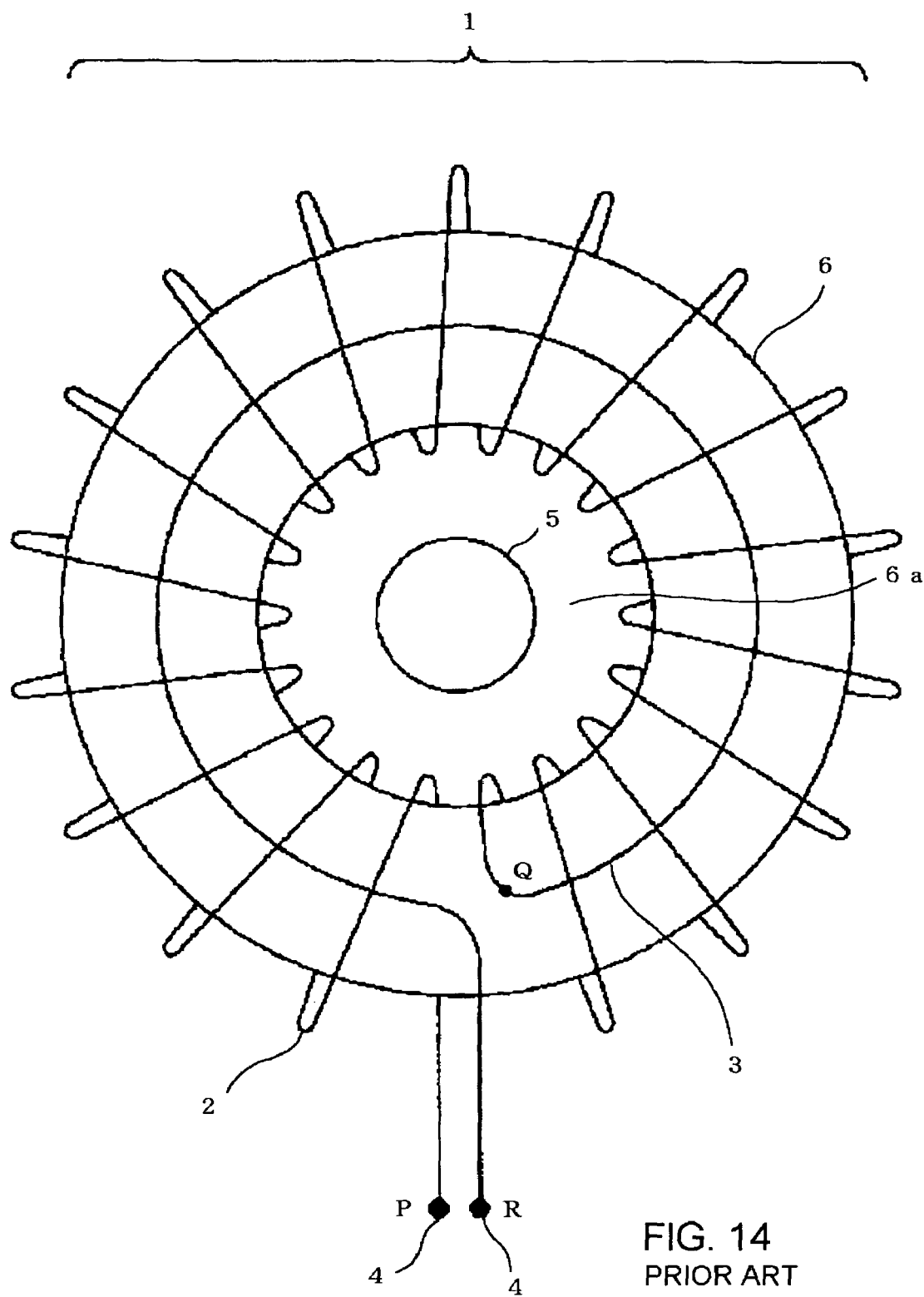
FIG. 14 is a front view showing a structure of a conventional common Rogowski coil.
Figure 15:
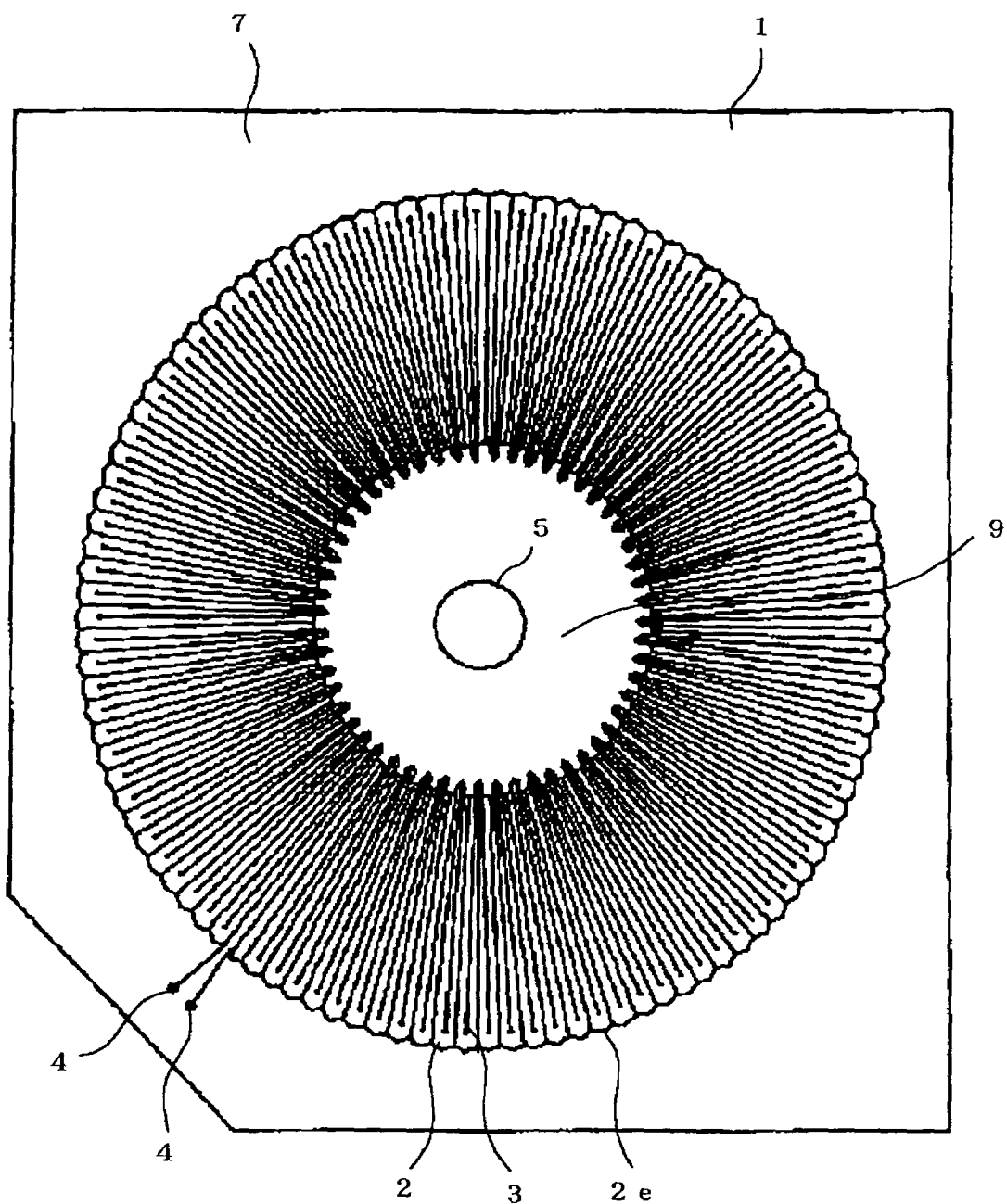
FIG. 15 is a front view showing a structure example of another conventional Rogowski coil.
Figure 17:
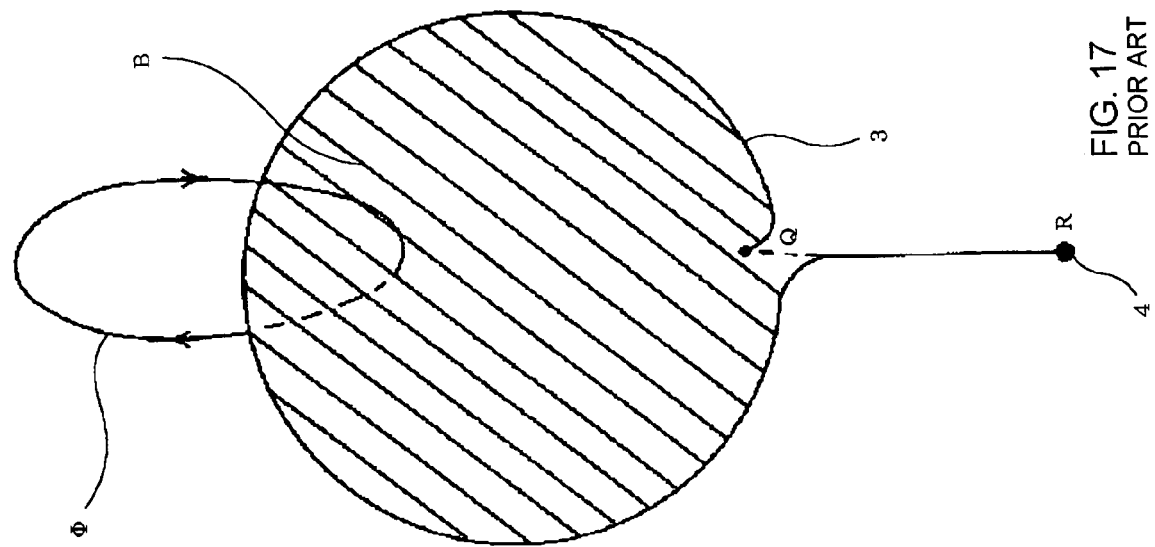
FIG. 17 is a pattern diagram that explains a state where an external magnetic field interlinks to a return circuit line in the Rogowski coil shown in FIG. 11.
Figure 16:
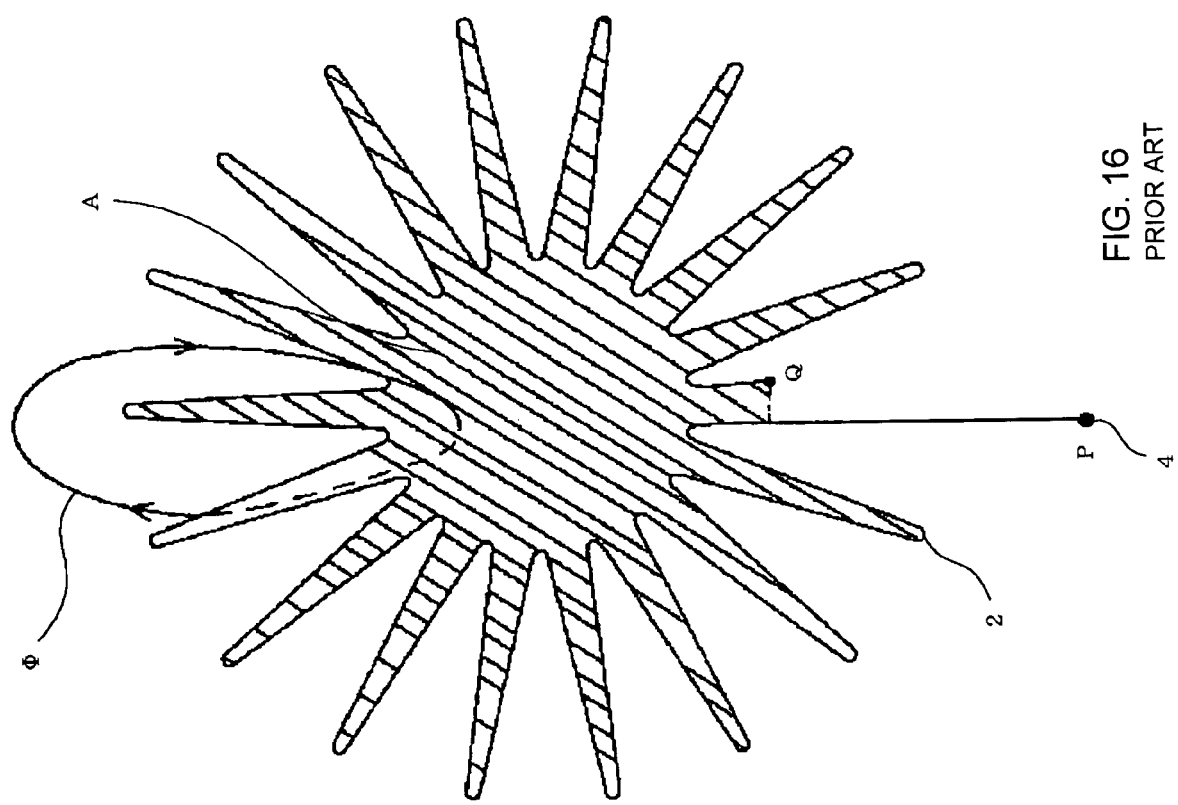
FIG. 16 is a pattern diagram that explains a state where an external magnetic field interlinks to a winding in the Rogowski coil shown in FIG. 14.
Figure 19:
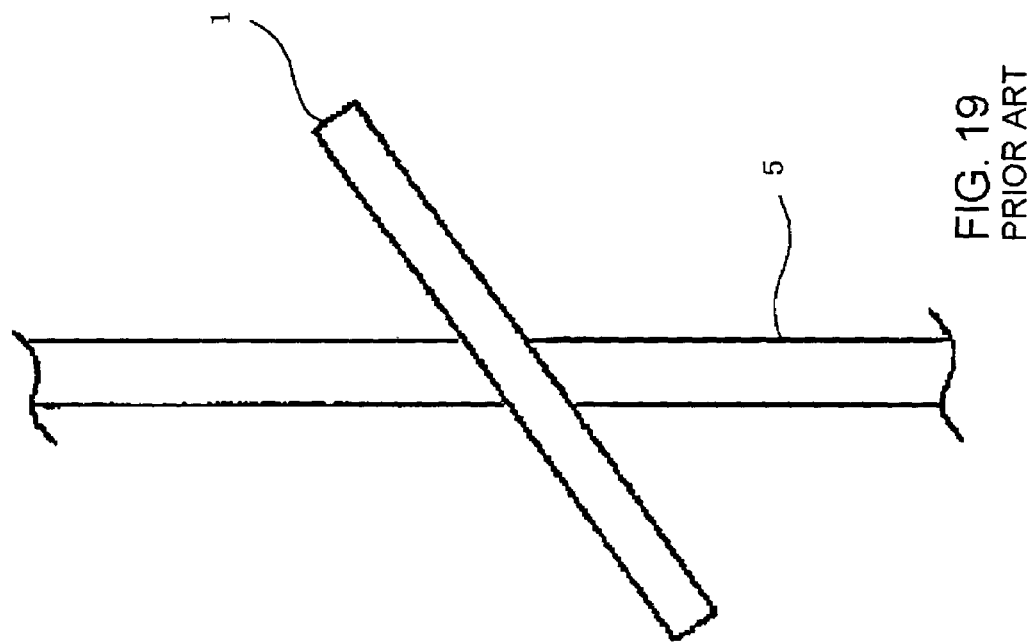
FIG. 19 is a pattern diagram for explaining another example of factors that generate an external magnetic field.

As for this Rogowski coil in this embodiment, the clockwise-wound windings 2-1, 2-3 correspond to the winding 2 of the conventional Rogowski coil shown in FIG. 14, and the counterclockwise-wound windings 2-2, 2-4, which are in a reverse direction of the clockwise-wound windings 2-1, 2-3, corresponds to the return circuit lines of the conventional one. To reduce influence of the external magnetic field, it is sufficient that total area surrounded by a first plurality of windings in one direction be equivalent to total area surrounded by a second plurality of windings in the direction opposite to that of the first plurality of windings, and this can be achieved easily and precisely in position with using general manufacture technique of the printed circuit board. Even when there is an external magnetic field penetrating the central opening 9 of the printed circuit board 7, magnetic flux Φ with a linkage owing to the external magnetic field is almost common in two pairs of a plurality of windings, wound along with a direction opposite to each other, and two voltages generated in two pairs of windings wound oppositely to each other are completely offset. Thus, influence toward current measurement owing to the external magnetic field can be prevented, and thus a current measurement can be realized with high accuracy.

In this embodiment, one case of the printed circuit board of multiple-layer composition with eight surfaces in which fourfold windings are formed is explained, however, similar situations such as sixfold windings or eightfold windings, and so on, wherein the number of the folded windings should be an even number, also enable to achieve actions and effects equivalent to those of this second embodiment as mentioned above. Although clockwise-wound windings and counterclockwise-wound windings are arranged alternatively in this embodiment, another case that the first and second windings are wound clockwise and the third and fourth windings are wound counterclockwise can also attain actions and effects equivalent to the above-mentioned case in this embodiment. Furthermore, in case that a number of the windings is 2*N, as far as a number N of windings are wound clockwise and a remaining a number N of windings are wound counterclockwise, under any order of lamination of the windings, actions and effects equivalent to those of the above-mentioned case can be attained.

(Third Embodiment)

Figure 8:
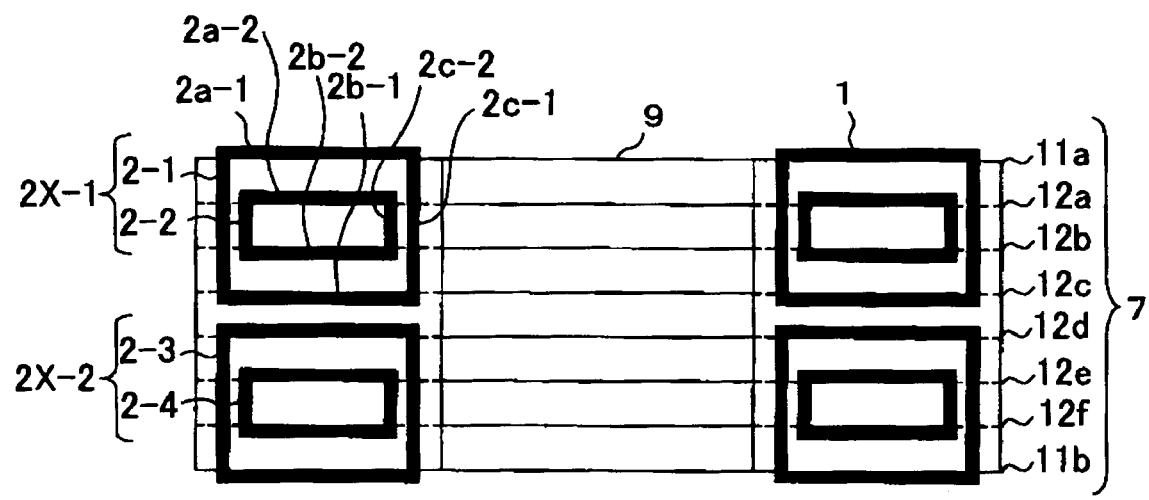
FIG. 8 is a sectional view showing a structure of a printed circuit board of a current transformer in a third embodiment of this invention.

FIG. 8 shows a Rogowski coil applied to a current transformer in accordance with a third embodiment of this invention. In this embodiment, firstly, a case forming fourfold windings to a printed circuit board of multiple-layer composition with eight surfaces is explained. In FIG. 8, a printed circuit board 7 is of multiple-layer composition with eight surfaces consisting of a circuit board top surface 11a, a circuit board bottom surface 11b, and six circuit board conducting internal surfaces 12a, 12b, 12c, 12d, 12e and 12f put between the circuit board top surface 11a and the circuit board bottom surface 11b. The printed circuit board 7 has a circular opening 9, in a center portion, which is penetrated by a conductor (not illustrated) in which alternating current of a main circuit passes.

As illustrated, radial metal foils 2a-1 are formed on the circuit board top surface 11a (the first surface) in form of a plurality of straight lines radially spreading with a center which is approximately equal to the center of the opening 9, and radial metal foils 2b-1 are formed on the circuit board conducting internal surface 12c (the fourth surface) in the same form as the radial metal foils 2a-1. The radial metal foils 2a-1 of the circuit board top surface 11a (the first surface) and the radial metal foils 2b-1 of the circuit board conducting internal surface 12c (the fourth surface) are electrically connected by a plated through-hole 2c-1 penetrating the printed circuit board 7 in a direction of thickness. The radial metal foils 2a-1, 2b-1 and the through-hole 2c-1 constitute a first winding 2-1 wound clockwise on the printed circuit board 7.

Similarly, radial metal foils 2a-2 are formed on the circuit board conducting internal surface 12a (the second surface) in form of a plurality of straight lines radially spreading with a center which is approximately equal to the center of the opening 9, and radial metal foils 2b-2 are formed on the circuit board conducting internal surface 12b (the third surface) in the same form as the radial metal foils 2a-2. The radial metal foils 2a-2 of the circuit board conducting internal surface 12a (the second surface) and the radial metal foils 2b-2 of the circuit board conducting internal surface 12b (the third surface) are electrically connected by a plated through-hole 2c-2 penetrating the printed circuit board 7 in a direction of thickness. The radial metal foils 2a-2, 2b-2 and the through-hole 2c-2 constitute a second winding 2-2. These clockwise-wound windings 2-1 and 2-2 are electrically connected in series and constitute one pair of doubled windings 2X-1.

Similarly, a third winding 2-3 and a fourth winding 2-4 are wound counterclockwise and formed in a same manner of the first winding 2-1 and the second winding 2-2 except their wound-direction, and these counterclockwise-wound windings 2-3 and 2-4 are electrically connected in series and constitute another one pair of doubled windings 2X-2. Here, the pair of doubled windings 2X-1 and another pair of doubled windings 2X-2 constitute a relation of mirror images each other, that is, enantiomorph. These two pairs of doubles windings 2X-1, 2X-2, which are mutually mirror images, are electrically connected in series.

According to this current transformer in accordance with this third embodiment of this invention, following actions and effects can be attained in addition to the actions and effects of the above-mentioned second embodiment. That is, as for this embodiment, one pair of the clockwise-wound windings 2X-1 correspond to the winding 2 of the conventional Rogowski coil shown in FIG. 14, and another one pair of the counterclockwise-wound windings 2X-2, which is in a reverse direction of the one pair of the clockwise-wound windings 2X-1, corresponds to the return circuit lines of the conventional one. Since the one pair of the clockwise-wound windings 2X-1 and the one pair of the counterclockwise-wound windings 2X-2 are mutually in mirror images in this embodiment, the total area surrounded by the clockwise-wound windings 2X-1 can be equivalent to that of the counterclockwise-wound windings 2X-2 much accurately. Even when there is an external magnetic field penetrating the central opening 9 of the printed circuit board 7, magnetic flux $\Phi$ with a linkage of two pairs of multiple windings owing to the external magnetic field is almost common in the two pairs, and two voltages generated in the two pairs of multiple windings are mutually offset, therefore, influence toward current measurement owing to the external magnetic field can be prevented, and thus a current measurement can be realized with high accuracy.

In this embodiment, one case of the printed circuit board of multiple-layer composition with eight surfaces in which fourfold windings are formed is explained, however, similar situations such as sixfold windings or eightfold windings, and so on, wherein the number of the folded windings should be an even number, also enable to achieve actions and effects equivalent to those as mentioned above.

(Fourth Embodiment)

Figure 9:
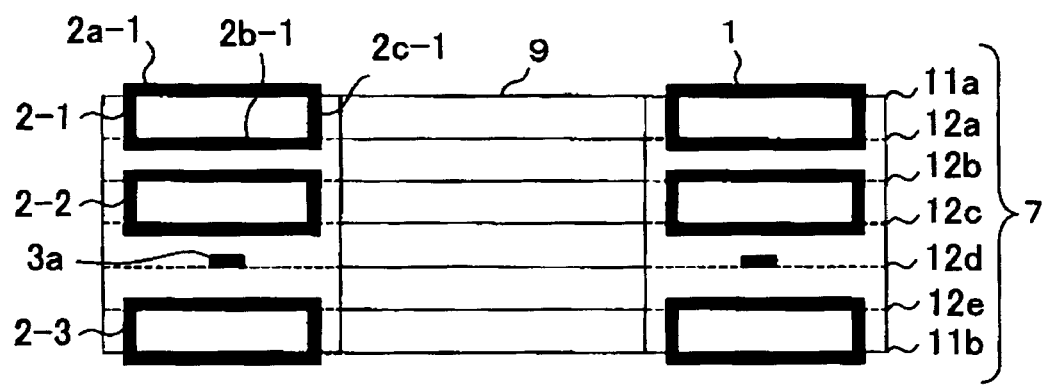
FIG. 9 is a sectional view showing a structure of a printed circuit board of a current transformer in a fourth embodiment of this invention.

FIG. 9 is an outlined sectional view of a printed circuit board of a Rogowski coil applied to a current transformer in accordance with a fourth embodiment of this invention, which will be explained hereinafter with referring the figure, as a deformed example of the Rogowski coil appeared in the second embodiment. In this embodiment, firstly, a case forming threefold windings to a printed circuit board of multiple-layer composition with seven surfaces is explained. In FIG. 9, a printed circuit board 7 is of multiple-layer composition with seven surfaces consisting of a circuit board top surface 11a, a circuit board bottom surface 11b, and five circuit board conducting internal surfaces 12a, 12b, 12c, 12d and 12e put between the circuit board top surface 11a and the circuit board bottom surface 11b. The printed circuit board 7 has a circular opening 9, in a center portion, which is penetrated by a conductor (not illustrated) in which alternating current of a main circuit passes.

As illustrated, this Rogowski coil 1 includes radial metal foils 2a-1 formed on the circuit board top surface 11a (the first surface) in form of a plurality of straight lines radially spreading with a center which is approximately equal to the center of the opening 9, and radial metal foils 2b-1 formed on the circuit board conducting internal surface 12a (the second surface) in the same form as the radial metal foils 2a. The radial metal foils 2a-1 of the circuit board top surface 11a (the first surface) and the radial metal foils 2b-1 of the circuit board conducting internal surface 12a (the second surface) are electrically connected by a plated through-hole 2c-1 penetrating the printed circuit board 7 in a direction of thickness. The radial metal foils 2a-1, 2b-1 and the through-hole 2c-1 constitute a first winding 2-1 wound clockwise on the printed circuit board 7.

Similarly, a second winding 2-2 is formed between the circuit board conducting internal surface 12b (the third surface) and the circuit board conducting internal surface 12c (the fourth surface), and a third winding 2-3 is formed between the circuit board conducting internal surface 12e (the sixth surface) and the circuit board bottom surface 11b (the seventh surface). Consequently, the printed circuit board 7 includes threefold windings consisting of the windings 2-1, the winding 2-2 and the winding 2-3. And a circular metal foil with a center which is equal to the center of the opening 9 is formed on the circuit board conducting internal surface 12d (the fifth surface) which is near a center of the printed circuit board 7 in a direction of thickness.

Here, the winding 2-1 is wound clockwise as illustrated, while the winding 2-3 is wound counterclockwise as illustrated, and the winding 2-3 is formed so that it may act as a return circuit line toward the winding 2-1, that is, an area surrounded by the winding 2-1 equals to an area surrounded by the winding 2-3. On the other hand, the circular metal foil 3a is formed so that it becomes a return circuit line toward the winding 2-2, that is, a radius of the circular metal foil 3a on the circuit board internal surface 12d of the printed circuit board 7 is determined so that an area surrounded by the winding 2-2 equals to an area surrounded by the circular metal foil 3a which is a return circuit line. The winding 2-1, the winding 2-2, the circular metal foil 3a and the winding 2-3 are electrically connected in series.

According to this current transformer in accordance with this fourth embodiment of this invention, following actions and effects can be attained in addition to the actions and effects of the above-mentioned second embodiment. That is, although the second embodiment is applied only when a number of the multiplexed windings is an even number, this embodiment can be applied when a number of the multiplexed windings is an odd number.

Under such situation, that is, a number of the multiplexed windings is 2·N+1, an error of measurement owing to the external magnetic field can be reduced by applying technique shown in the second embodiment into a number 2·N of windings, a half of which are wound in a direction opposite to that of another half. Actually, in FIG. 9, the wound direction of the winding 2-1 is opposite to that of the winding 2-3. And as for one remaining winding (corresponds the winding 2-2 in FIG. 9), an error of measurement owing to the external magnetic field can be reduced by applying technique shown in the first embodiment into the one remaining winding and adjusting an area of one circular metal foil (corresponds to the circular metal foil 3a in FIG. 9) as a return circuit line. Consequently, even when there is an external magnetic field penetrating the central opening 9 of the printed circuit board 7, influence in current measurement of the external magnetic field can be prevented and thus a current measurement can be realized with high accuracy.

In this embodiment, one case of the printed circuit board of multiple-layer composition with seven surfaces in which threefold windings are formed is explained, however, similar situations such as fivefold windings, sevenfold windings, ninefold windings, or elevenfold windings, and so on, wherein the number of the folded windings should be an odd number, also enable to achieve actions and effects equivalent to those as mentioned above.

(Fifth Embodiment)

Next, a fifth embodiment of this invention is explained with reference to FIG. 10. This fifth embodiment is a modified example of composition of a Rogowski coil 1 shown in either one of the first to fourth embodiments, thus here the composition of a printed circuit board applied in this embodiment is the same as that of one of the first to fourth embodiment, and is explanation thereof is omitted here.

Figure 10:
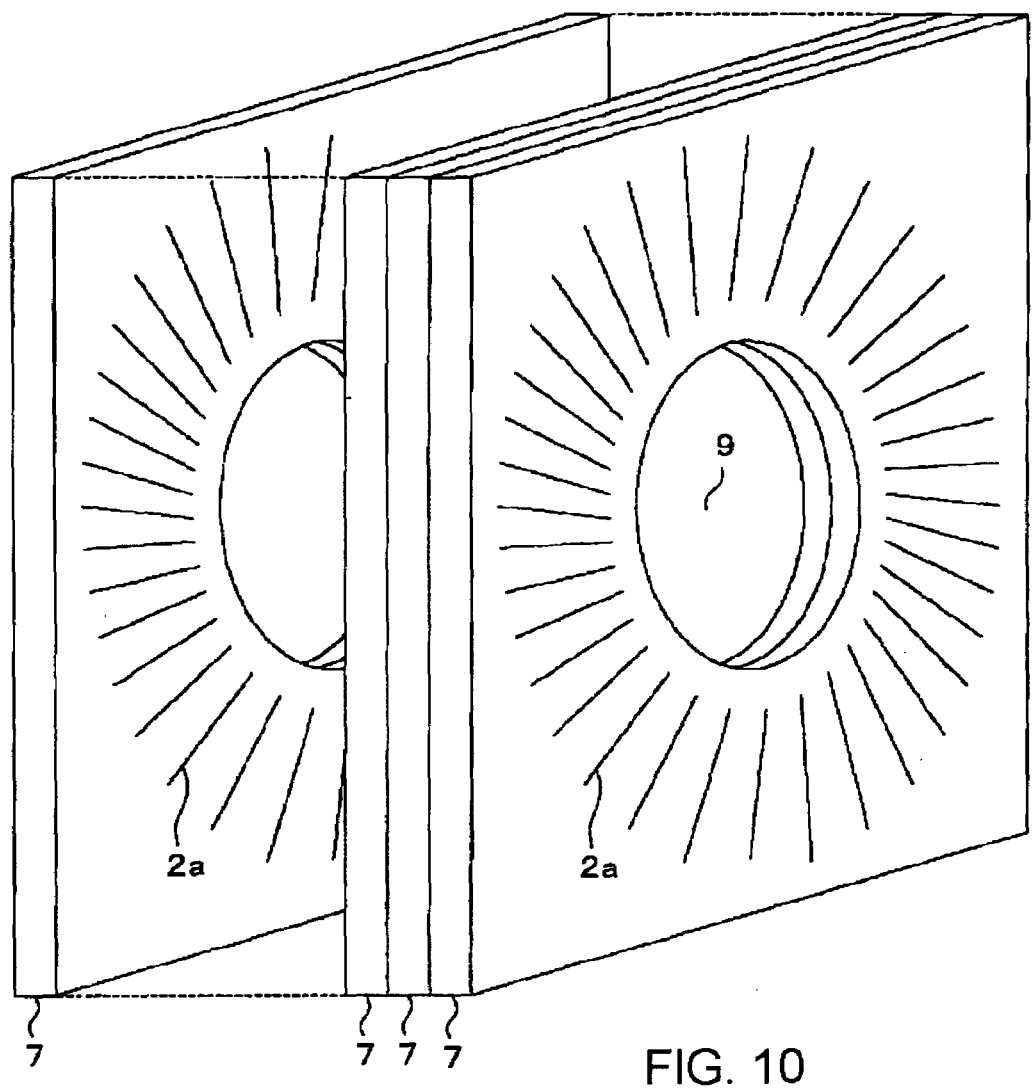
FIG. 10 is a sectional view showing a structure of a printed circuit board of a current transformer in a fifth embodiment of this invention.

In FIG. 10, a Rogowski coil includes a plurality of the printed circuit boards 7, mentioned in at least one of the first to fourth embodiments, which are fixed closely to each other so that an axis of central opening 9 of each printed circuit board 7 is adjusted to each other. The printed circuit boards 7 are electrically connected in series to each other.

According to this current transformer in accordance with this fourth embodiment of this invention, following actions and effects can be attained in addition to the actions and effects of the above-mentioned first to fourth embodiment. That is, an output voltage of the Rogowski coil 1 is a sum of each of the printed circuit boards 7 and the output voltage in a unit current and a unit frequency is appeared by multiplying each voltage of one printed circuit board and a number of sheets of the printed circuit boards 7. Accordingly, in this embodiment, an output voltage in a unit current and a unit frequency, that is, a sensitivity of the Rogowski coil 1, can be adjusted with holding a condition that an area surrounded by windings equals to an area surrounded by return circuit lines. Therefore, an output voltage of a level suitable for processing in a sensor unit mentioned later, can be easily acquired with preventing to receive influence of the external magnetic field to current measurement.

(Sixth Embodiment)

Figure 11:
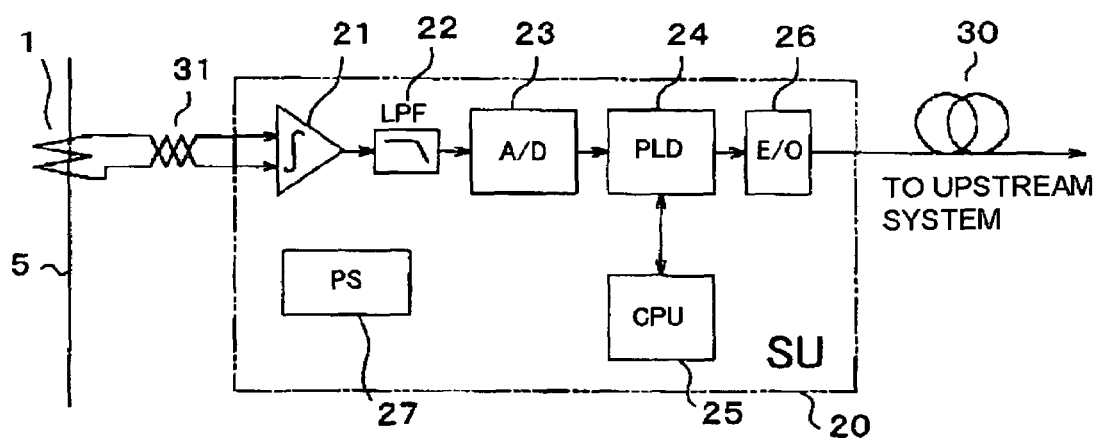
FIG. 11 is a block diagram showing a structure of a current transformer system in a sixth embodiment of this invention.

Next, a sixth embodiment of this invention is explained with reference to FIG. 11, which is a system block diagram of a current transformer of this embodiment. This current transformer shown in this figure includes a Rogowski coil 1 attached with a penetrating conductor 5, a sensor unit (SU) 20 arranged in the periphery of the Rogowski coil 1, and an optical transmission unit 30. A twisted-pair electric wire 31 connects the Rogowski coil 1 and the sensor unit 20. Here, the composition of the Rogowski coil 1 is the same as that of the Rogowski coil including at least one printed circuit board 7 appeared in one of the above first to fifth embodiments, and thus explanation of the composition is omitted.

The sensor unit 20 includes an integrator 21 which carries out analog signal processing of an analog-voltage signal input from the Rogowski coil 1 through the twisted-pair electric wire 31, a low-pass filter (LPF) 22 which cuts off higher harmonics in order to reduce overlapping alias error before analog-to-digital conversion, an analog-to-digital converter (A/D converter) 23 which converts an analog-voltage signal into a digital electric signal, a programmable logic device (PLD) 24 which processes the digital electric signal, a central processing unit (CPU) 25, an electric-to-optic converter (E/O converter) 26 which converts from the digital electric signal into a digital optical signal and outputs the digital optical signal, and a power supply circuit 27.

The power supply circuit 27 provides a voltage necessary for processing of the sensor unit 20 such as DC ±5 V or DC ±3.3 V from a voltage supplied from, for example, a common power source (not illustrated) in an electric power installation such as DC 110 V, DC 48 V or DC 220 V (which is generally suited to a standard power source of an electric power installation). Moreover, the sensor unit 20 may have a backup power supply such as a battery (not illustrated).

In addition, although the Rogowski coil 1 connected to the sensor unit 20 is illustrated as one in this figure, the input is not necessarily just one channel. That is, for example, for a three phase encapsulated GIS (gas insulation switch), three phases, i.e., phase U, phase V and phase W, of outputs of the Rogowski coils may be input to one sensor unit. In this case, the sensor unit 20 is constituted so that a number of analog input circuits having the integrator 21 and the LPF 22 corresponds to a number of input channels, and one A/D converter 23 performs analog-to-digital conversion with an analog multiplexer (not illustrated) which switches one of the multiple analog inputs to common output in turn by turn. The PLD 24 and the downstream structure are the same as in the case of one channel input. In addition, each output terminal of the Rogowski coils 1 and each input terminal of the sensor unit 20 with multi-channel components are connected one-on-one by a twisted-pair electric wire 31, respectively. The optical transmission unit 30 transmits a digital optical signal from the sensor unit 20 into upstream system such as a protection control unit. Although not illustrated, an optical transmission channel may be composed by either way of a point-to-point transmission channel, or connected through local area network (LAN).

According to this current transformer in accordance with this fourth embodiment of this invention, following actions and effects can be attained in addition to the actions and effects of the above-mentioned first to fourth embodiment. The output voltage of the Rogowski coil 1 is an analog-voltage signal proportional to a differentiation value of an alternating current of a main circuit flowing in the conductor 5, and the output voltage is input into the sensor unit 20 through the twisted-pair electric wire 31. The analog-voltage signal input into the sensor unit 20 is integrated by the integrator 21 to provide an analog electric signal proportional to the alternating current of the main circuit. Next, the low-pass filter 21 reduces higher harmonics of the signal, which causes a overlapping alias error, and thereafter the signal is converted into a digital electric signal by the A/D converter 23.

PLD 24 and CPU 25 process the digital electric signal. That is, PLD 24 processes to generate a timing signal (synchronized signal) of the A/D converter 23, to generate a control signal, and exchanges data with CPU 25, and so on. CPU 25 changes a digital electric signal into a transmission format of, for example, using the Manchester encoding. In the present circumstances, the transmission format can be added with a cyclic redundancy check (CRC) code or a reversal dual redundant code, etc. for improving transmission reliability. The digital electric signal processed by PLD 24 and CPU 25 is changed into a digital optical signal by the E/O converter 26, and thereafter transmitted to upstream system, such as a protection unit or a control unit, through the optical transmission unit 30.

Since the Rogowski coil, which is explained in the first to fifth embodiment and applied the current transformer in this embodiment, comprises printed circuit boards, an upper limit of a secondary output voltage thereof is about a few volts per kiloampere even though multiplexed windings structure is applied, then, there is a problem in a noise-proof aspect for long-distance transmission of the secondary output voltage. However, in this embodiment, since the sensor unit 20 for converting the secondary output voltage into the digital optical signal is arranged so close to the Rogowski coil including the printed circuit boards 7 that the effect of the external noise can be disregarded, the transmission distance as an analog electric signal is sufficiently short, that is, preferably at most one meter, and thus the problem of degradation of signal quality due to the influence of the external noise can be avoided. Especially, since the Rogowski coil 1 and the sensor unit 20 are connected by the twisted-pair electric wire 31, the influence of electromagnetic induction by the external magnetic field to a minute analog-voltage being transmitted from the Rogowski coil 1 to the sensor unit 20, can be reduced.

Since the digital optical signal is transmitted between the sensor unit 20 and upstream system such as a protection unit or a control unit of an electric power installation main control building, then there is no signal degradation by the influence of the noise even in long-distance transmission, therefore, a high quality measure of alternating current can be provided to the protection unit or the control unit.

Moreover, since this Rogowski coil of the printed circuit board type has a multiple windings structure, the secondary output voltage of the Rogowski coil to be inputted into the sensor unit 20 can be several times as high as that of the conventional Rogowski coil. Accordingly, S/N (signal to noise ratio) of the sensor unit can be easily improved, and the quality of measure of alternating current provided to the protection unit or the control unit can be raised compared to the conventional matter.

In addition, CPU 25 may apply a digital filter to the digital electric signal which expresses the measure of alternating current of the main circuit. And software running on the CPU 25 may be provided so that variation of the Rogowski coils 1 and analog circuits of the sensor unit 20 such as the integrator, low-pass filter circuits, can be compensated in terms of sensitivity compensation and/or phase compensation. Moreover, effective values of alternating current of the main circuit have been calculated in the upstream system such as BCU (bay control unit) conventionally, however, in this embodiment, CPU 25 may calculate such effective values and transmit the result to the upstream system. Moreover, CPU 25 may perform temperature compensation by arranging a temperature sensor (not illustrated) in the sensor unit 20. Since the sensor unit 20 is at the periphery of the Rogowski coil 1 in this embodiment, the temperature measured in the sensor unit 20 can be assumed to equal to an ambient air temperature of the Rogowski coil 1, and the temperature compensation can be accurately performed.

Furthermore, this embodiment can also attain a following supplemental effect. That is, an input and output circuit which has conventionally been mounted on a protection unit and/or a control unit for connecting to substation main circuit equipment can be deleted, and all input and output of the protection unit and/or the control unit are performed through an transmission unit and there is no circuit treating high voltage and large current, thus hardware structure of the protection unit and/or the control unit mainly comprises only a digital calculation processing portion for processing protection function and/or control function and a communication portion for performing communication processing, therefore, many hardware components can be reduced.

Furthermore, since the current transformer of this embodiment also has a calculation function provided by CPU 25, a part of operation, which has been conventionally performed with the protection unit and/or the control unit, can be executed by proxy, and the operation burden of the protection unit and/or the control unit side can be reduced. Moreover, by partly burdening the calculation which has been conventionally performed in the protection unit and/or the control unit, there occurs a vacant time in CPU of the protection unit and/or the control unit, and thus the protection unit and/or the control unit can perform further advanced protection and/or control calculation function and/or monitoring function by utilizing the vacant time. Therefore, the protection unit and/or the control unit can additionally perform advanced protection and/or control calculation and/or monitoring functions, and thus performance of a substation protection and control system as a whole can be improved.

(Seventh Embodiment)

Figure 12:
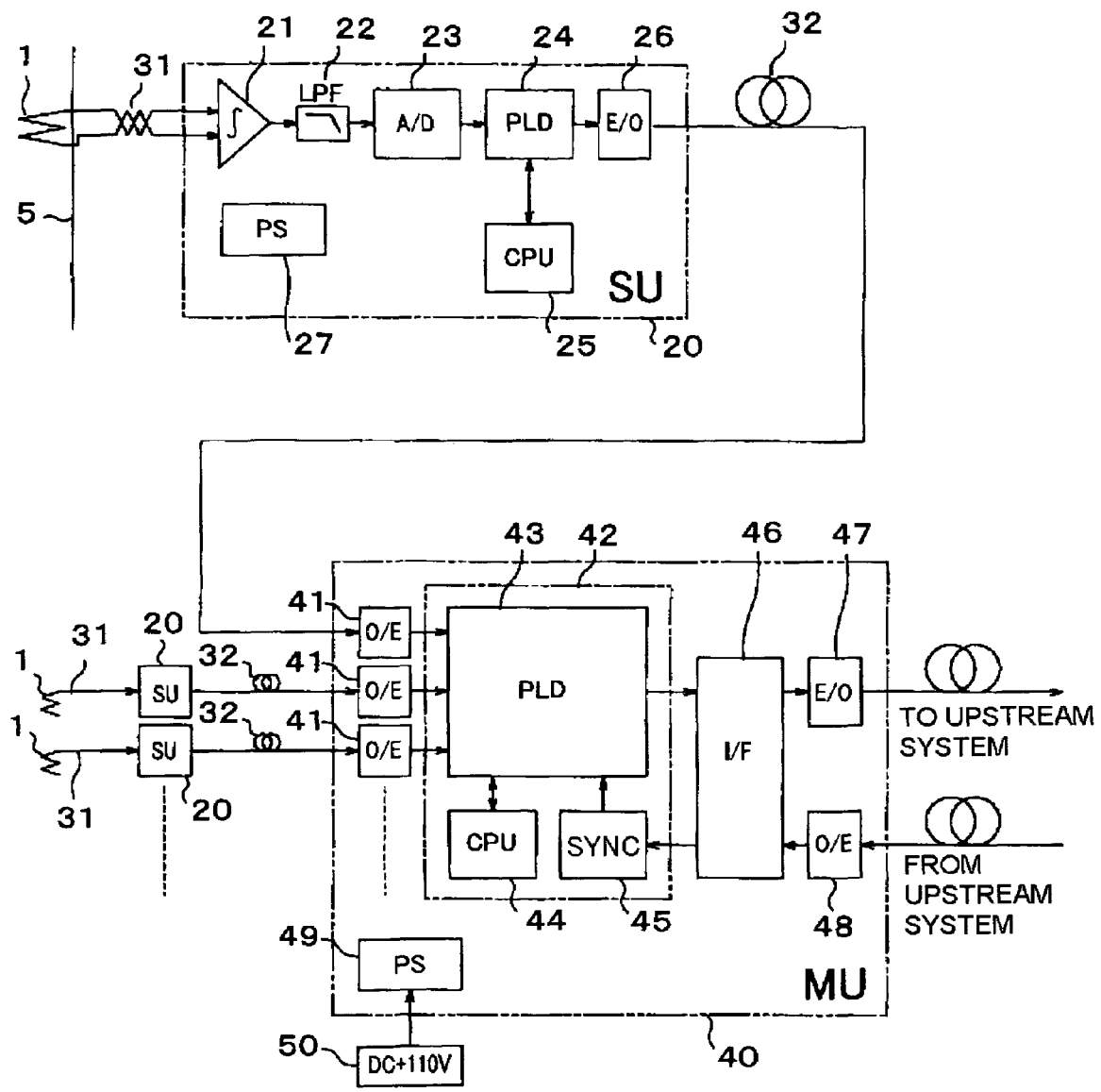
FIG. 12 is a block diagram showing a structure of a current transformer system in a sixth embodiment of this invention.

Next, a seventh embodiment of this invention is explained with reference to FIG. 12, which is a system block diagram of a current transformer of this embodiment. This current transformer shown in this figure includes Rogowski coils 1 each attached with a penetrating conductor 5, sensor units (SU) 20 each arranged in the periphery of the Rogowski coil 1, optical transmission unit 32, and a merging unit (MU) 40 for merging a plurality of digital optical signals transmitted from the sensor units 20. Here, the composition of the Rogowski coil 1 is the same as that of the Rogowski coil including at least one printed circuit board 7 appeared in one of the above first to fifth embodiments, and thus explanation of the composition is omitted. The composition is the sensor units 20 is the same as one shown in FIG. 11 and the sixth embodiment, and thus explanation of the composition is omitted.

An example of structure of the merging unit 40 is explained with reference to Fiog. 12. Each of the sensor units 20 is connected with the merging unit 40 by the respective optical transmission unit 32. The merging unit 40 is mainly composed of an optic-to-electric converter (O/E converter) 41 which converts an inputted digital optical signals outputted from the respective sensor unit 20 into a second digital electric signal, an merging unit 42 which merges a plurality of the second digital electric signals to generate a merged electric transmission signal, a communication interface 46 that communicates with upstream system, a second electric-to-optic converter (second E/O converter) 47 which converts the merged electric transmission signal into a second digital optical signals, and a power supply circuit 49, and so on.

The merging unit 42 has PLD 43, CPU 44, and a synchronizing unit 45, and so on. An optic-to-electric converter (O/E converter) 48 linking to upstream system converts a synchronizing signal outputted from the upstream system as a optical signal into an electric synchronizing signal. The power supply circuit 49 provides a voltage necessary for processing of the merging unit 40 such as DC ±5 V or DC ±3.3 V from a voltage supplied from, for example, a common power source 50 in an electric power installation such as DC 110 V (or DC 48 V or DC 220 V, which is generally suited to a standard power source of an electric power installation.). Moreover, the merging unit 40 may have a backup power supply such as a battery (not illustrated).

A treatment of a plurality of digital optical signals, including information of measure of alternating current, from the sensor units 20 linked to the merging unit 40, has several variations. For example, the digital optical signals may be merged into an merged transmission signal by the unit of bay, such as line bay, or by the unit of zone of protection and/or control, or the signals may be merged into a plurality of merged transmission signals by the unit of zone of protection and/or control. In the merging of the merged transmission signal by the merging unit 40, the merged signal is not limited to a certain regular format, but in a format most suitable according to layout of a substation or system configuration of a protection unit and/or a control unit, and so on.

According to the current transformer in the fifth embodiment of this invention with the above-mentioned structure, following actions and effects can be acquired. The actions of the Rogowski coil 1 and the sensor unit 20 are same as those of in the first to sixth embodiments mentioned above, and their explanations are omitted. In the merging unit 40, each O/E converter 41 receives the respective digital optical signal outputted from the respective sensor units 20, and converts the digital optical signal into the second digital electric signal. And the merging unit 42 merges the second digital electric signals and generates a merged electric transmission signal. This merged electric transmission signal is converted into the second digital optical signal by the communication interface 46 and the E/O converter 47, thus the second digital optical signal is transmitted into upstream system such as a protection unit or a control unit.

Next, an action of the merging unit 42 is explained in detail. The second digital electric signal converted by,the O/E converter 41 is inputted into the PLD 43, where data processing is performed. Here the PLD 43 checks the CRC code or the reversal dual redundant code, and detects a transmission error if there is the transmission error. The synchronizing unit 45 receives a base signal for time synchronization and base time data and extracts and generates a sampling synchronization signal and time data for time stamps. The CPU 44 extracts a digital value of measure of alternating current out of the second digital electric signals received from the sensor units 20, and operates synchronization compensation calculation to correct a deviance of sampling synchronization based on the sampling synchronization signal, and generates a merged electric transmission signal by adding necessary information such as the time stamps and the CRC code to the digital value of alternating current after the synchronization compensation calculation. The CPU 44 also monitors abnormality of the sensor units 20, monitors abnormality of the merging unit 40 by self-monitoring, and outputs an alarm to the upstream system when an abnormality is detected. In addition, the monitoring abnormality of the sensor unit 20 means, for example, monitoring abnormality of a power source of the sensor unit 20, monitoring accuracy of the A/D converter 23, or monitoring of analog circuits.

Figure 13:
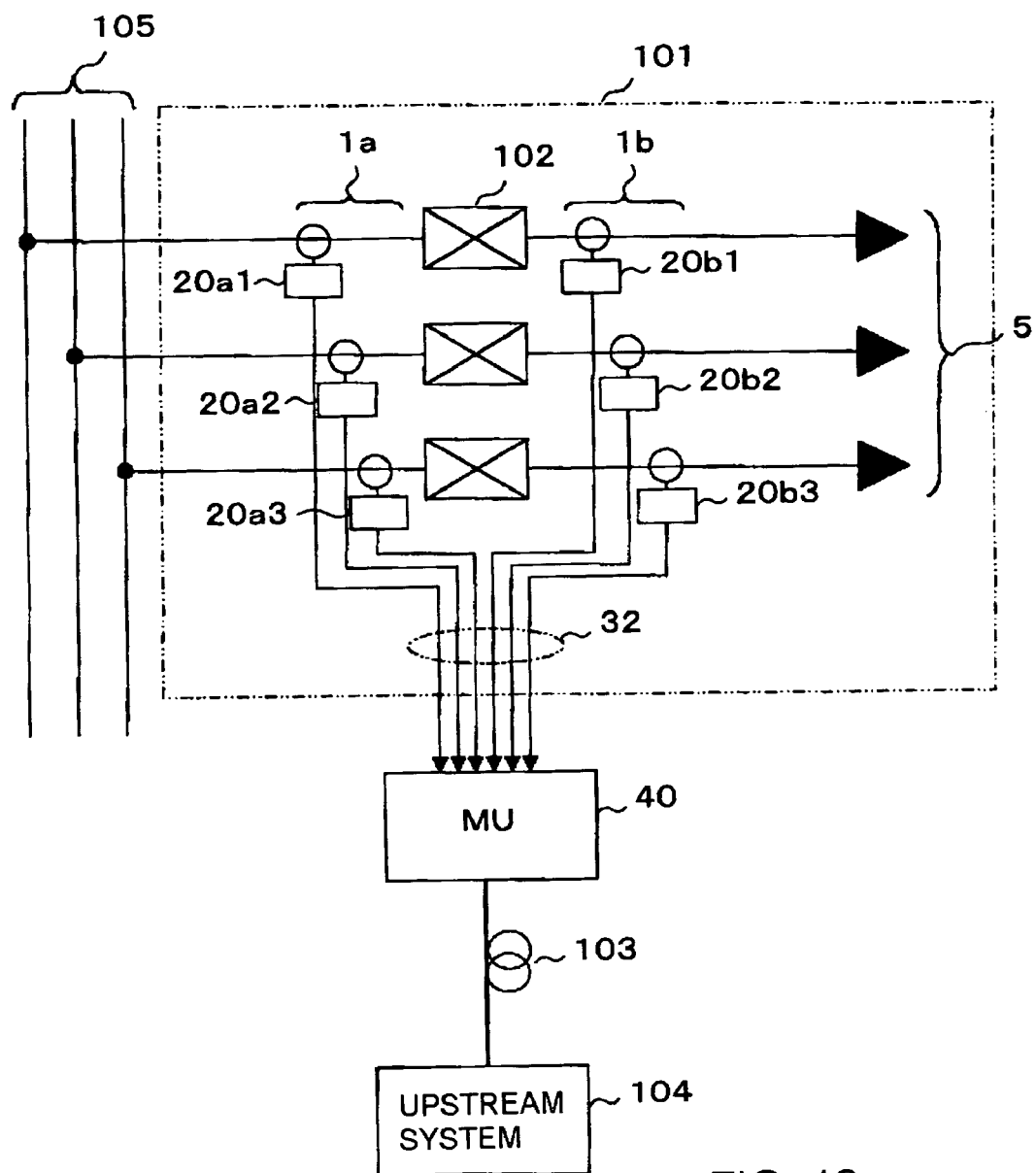
FIG. 13 is a block diagram showing an example of a system that transmits a plural measure of alternating current per one bay as one merged transmission signal in accordance with a seventh embodiment of this invention.

FIG. 13 shows an example of system configuration in case of transmitting a plurality of measures of alternating current by the unit of bay, which is the unit of zone of protection and control, as one merged transmission signal. This figure shows an example of a feeder bay 101 of single phase encapsulated type switchgear in single busbar scheme 105, shown in a three-phase line diagram. The Rogowski coils 1 (1a and 1b) are arranged on both sides of the circuit breaker 102, a conductor penetrates the Rogowski coils 1a, 1b, and the sensor units 20 (20a1, 20a2, 20a3, 20b1, 20b2, 20b3) are arranged at periphery of the Rogowski coils 1a, 1a, 1a, 1b, 1b, 1b, respectively. Each of the sensor units 20a1, 20a2, 20a3, 20b1, 20b2, 20b3 and the merging unit 40 are connected with an optical transmission unit 32. Upstream system 104, such as a protection unit and/or a control unit, and the merging unit 40 are connected with a second optical transmission unit 103. The merging unit 40 merges all of digital optical signals, i.e., digital values of measures of alternating currents, transmitted from all the sensor unit 20a1 through 20b3 in the feeder bay 101, into a merged transmission signal, and transfers the merged transmission signal to the upstream system.

Accordingly, the merging unit 40 arranged near a substation main circuit equipment can transmit information of measures of alternating current by the unit of zone of protection and control, therefore, transmission means can be operated efficiently. Since a digital optical signal is transmitted between the merging unit 40 and a protection unit and/or a control unit in an electric power installation main control building, a signal is not degraded even in a long distance transmission, thus measures of alternating current can be provided into the protection unit and/or the control unit with high quality. Moreover, since a lot of the electric cables, which has connected on-site electric power distribution main circuit equipment or substation main circuit equipment and the protection unit and/or the control unit in an electric power installation main control building, can be reduced. Furthermore, an installation time of installing substation equipments and an installation cost also can be minimized.

In addition, the following effect can be acquired as a supplementary effect in this embodiment. That is, an input and output circuit which has conventionally mounted on a protection unit and/or a control unit for connecting to electric power distribution main circuit equipment and/or substation main circuit equipment can be deleted, and all input and output of the protection unit and/or the control unit are performed through transmission means and there is no circuit treating high voltage and large current, thus hardware structure of the protection unit and/or the control unit is mainly constituted only by a digital calculation processing portion for processing protection function and/or control function and a communication portion for performing communication processing, therefore, many hardware components can be reduced.

Furthermore, since the current transformer of this embodiment also has a calculation function by CPU 25, a part of operation, which has been conventionally performed with the protection unit and/or the control unit, can be executed by another CPU in a current transformer side, and the operation burden of the protection unit and/or the control unit can be reduced. Moreover, by partly burdening the calculation which has been conventionally performed in the protection unit and/or the control unit, there occurs a vacant time in CPU of the protection unit and/or the control unit, and thus the protection unit and/or the control unit can perform further advanced protection and/or control calculation function or monitoring function by utilizing the vacant time. Therefore, the protection unit and/or the control unit can additionally perform advanced protection and/or control calculation and/or monitoring function, and thus performance of a substation protection and control system as a whole can be improved.

In addition, the merging of digital values of measures of alternating currents into an merged transmission signal is not limited to merging to one merged transmission signal. Hereafter, one example of merging into two merged transmission signals is explained. That is, in FIG. 10, the measure of alternating current of the Rogowski coil 1*a* attached in a busbar 105 side of the circuit breaker 102 is used for line protection relay (not illustrated). On the other hand, the measure of alternating current of the Rogowski coil 1*b* attached in an electric feeder cable (not illustrated) side of the circuit breaker 102 is used for protection operation of a bus protective relay (not illustrated). In order to arrange that a discrimination of a kind of a measure of sending current is not necessary for a protection relay side, as for the line protection relay, measures of alternating currents transmitted from the sensor units 20*a*1, 20*a*2, 20*a*3 are merged into a first merged transmission signal to be transmitted to the line protective relay. On the other hand, for the bus protection relay, measures of alternating current transmitted from the sensor units 20*b*1, 20*b*2, 20*b*3 are merged into a second merged transmission signal to be transmitted to the bus protection relay. This method for generating the merged transmission signals is especially effective in a case where the merging unit and each unit of the upstream system 104, such as a line protection relay, a bus protection relay or BCU, are connected through a point-to-point transmission channel.

Next, several modification examples of embodiments of this invention are explained. As for the sixth embodiment, among various calculation functions which CPU 25 of the sensor unit 20 performs, at least a part of calculation functions not concerned with data transmission between the sensor unit 20 and the merging unit 40 (such as sensitivity compensation or phase compensation) may be performed in CPU 44 of the merging unit 40 instead of the CPU 25 of the sensor unit 20. It is clear that the same effect as that of this seventh embodiment can be also acquired in this modification example. In this case, the necessary function of the sensor unit 20 is mainly just converting an analog-voltage signal outputted from the Rogowski coil 1 into a digital optical signal and transmitting data to the merging unit 40 through the optical transmission unit 32. Accordingly, the CPU 25 of the sensor unit can be eliminated and the composition of the sensor unit 20 becomes very simple hardware composition. Here, the elimination of the CPU 25 means that control LSI (large-scale integration) corresponding to CPU with high accuracy is unnecessary. However, it is still necessary to mount minimal control unit required for realizing control for analog-to-digital conversion and optical transmission. To satisfy this need, for example, control by the PLD 24, or a combination of versatile logic IC (integrated circuits) makes possible to realize such a control.

Moreover, another modification example of this embodiment is explained. Here in this seventh embodiment, sampling timing of the analog-to-digital conversion of the analog-voltage signal performed in the sensor units 20 is made asynchronous among the sensor units 20, and the CPU 44 of the merging unit 40 performs synchronous compensation calculating operation based on the sampling synchronization signal transmitted from the upstream system. On the other hand, it is also possible to transmit the sampling synchronization signal from the merging unit 40 into the sensor unit 20, and to perform sampling of the analog-to-digital conversion based on this sampling synchronization signal in the sensor unit 20. That is, the sampling timing in the sensor unit 20 can be synchronized with a time synchronous standard signal which is common in a transformer substation. In this case, the sampling synchronization signal is transferred from the merging unit 40 into the sensor unit 20 by optical transmission unit. Although not illustrated, the optical transmission unit for transmitting the sampling synchronization signal are added as hardware components to both the sensor unit 20 and the merging unit 40, respectively. Clearly in this case, the sensor unit 20 may or may not have CPU 25, whichever is applicable for the construction. However, in both cases, it is effective to add the time stamps by the CPU 44 of the merging unit 40.

In this modified example, the same effect as that of the seventh embodiment can be acquired, and in addition, there is also the following effect. That is, in this modified example, the sampling timings of the analog-voltage signals among a plurality of the sensor units 20 are synchronized based on the time synchronization standard signal common to an electric power installation. Thus the CPU 44 of the merging unit 40 does not need to carry out sampling synchronous compensation operation, thereby the load of the CPU 44 and the burden of developing software are reduced. In addition, in this modified example, the time synchronization standard signal common to an electric power installation is transmitted to the sensor unit 20 through the merging unit 40. However, arranging a hardware component so that the time synchronization standard signal common to a substation is directly transmitted into the sensor unit 20, can acquire the same effect as mentioned above, too.

Furthermore, this invention is not limited to the above-mentioned detailed embodiments, but includes one supplemental embodiment of a current transformer that the merging unit 40 is connected to each unit of the upstream system, such as a line protection relay, bus protection relay or BCU, through each of point-to-point transmission channel. According to such an embodiment, transmission information between the current transformer and the upstream system can be simplified, thus the whole system can be simplified. Here, it may be effective, in many cases, to generate a plurality of the merged transmission signal by the merging unit 40, according to transmission destinations such as a line protection relay or a bus protection relay.

Moreover, this invention also includes one supplemental embodiment of a current transformer such that the current that the merging unit 40 is connected to each unit of the upstream system, such as a line protection relay, bus protection relay or BCU with LAN (local area network). According to such an embodiment, transmission information between the current transformer and the upstream system is transmitted on one LAN, thereby, information can be commonly shared in various locations, and structure of a connection portion can be also standardized. Moreover, to improve the reliability of whole system of the current transformer, the Rogowski coil 1, the sensor unit 20, and the integrated merging unit 40 may be duplicated, respectively. As for redundant composition, all of the components may be completely duplicated, or partly duplicated, and the redundancy can be formulated according to balance between cost and reliability required by the system to which the current transformer is applied, and here, it should not limit to one certain redundant composition.

Moreover, this invention mainly concerns a computerized current transformer; however, a computerized instrument voltage transformer might be combined as a part of an embodiment of this invention. That is, when an adopted instrument voltage transformer is electrical instrument voltage transformer, and has a digital output, or the electrical instrument voltage transformer with an analog signal or a conventional instrument voltage transformer is adopted and additionally a conversion unit for analog-to-digital converting of an analog output of the electrical instrument voltage transformer with an analog output or the conventional voltage transformer, the merging unit 40 as mentioned in the seventh embodiment can be arranged to operate also with the digital signal from the instrument voltage transformer. The merging unit can transmit the measures of alternating current and voltage of a main circuit detected by the electrical current transformer and the electrical instrument voltage transformer together, that is, both current information and voltage information by one unit of zone of protection and control, into the upstream system. In this case, the transmission means can be effectively managed, and further, a large measure of electric cables connecting between one of on-site distribution main circuit equipment or substation main circuit equipment and one protection unit and/or one control unit of a main control building of an electric power installation. Furthermore, a time for installing substation equipment and installation cost can be reduced.

According to this invention explained above, applied with a general multiple-layer circuit board manufacture technique of a printed circuit board, forming metal foils mounted on a circuit board front surface, a circuit board reverse surface, and circuit board internal surfaces, forming windings by electrically connecting the metal foils to penetrate the circuit board, connecting in series each of the windings and a metal foil as a return circuit line mounted on a circuit board internal surface, and adjusting a radius of each winding so that an area surrounded by the winding is equivalent to an area surrounded by the return circuit, enable to acquire a current transformer, which is not influenced by an external magnetic field penetrating the central opening of the Rogowski coil and excellent in withstanding noise, for performing current measurement with high accuracy and relatively low manufacture cost.

Moreover, combination of the Rogowski coil with multiple windings and a sensor unit transforming converting a second output voltage of the Rogowski coil into a digital optic signal enables to acquire a current transformer, which is not influenced by the external magnetic field and excellent in withstanding noise, for performing current measurement with high accuracy and relatively low manufacture cost.

What I claim is:

1. A current transformer, comprising:
    a Rogowski coil, having an opening at the center in which a conductor penetrates, comprising:
        a printed circuit board comprising at least 2N layers and further comprising at least 2N circuit board surfaces, whereby N is an integer greater than 2;
        a plurality of radial metal foils on each of 2N of the at least 2N circuit board surfaces, each metal foil extending along an axis that radiates from approximately the center of the opening;
        N windings, each winding formed by electrically connecting metal foils on a respective pair of circuit board surfaces with plated through holes penetrating the circuit board surfaces in a thickness direction of the printed circuit board; wherein a first winding is comprised of metal foils on a board top surface and a board bottom surface;
        N return circuit lines; wherein the return circuit lines are approximately circular metal foils with a center that is approximately the center of the opening; each of the return circuit lines being electrically connected with one of the N windings in series to form N winding—return circuit line pairs;
        wherein the N winding—return circuit line pairs are in turn connected in series with one another.

2. A current transformer, comprising:
    a Rogowski coil, having an opening at the center in which a conductor penetrates, comprising:
        a printed circuit board comprising at least 2N layers and further comprising at least 2N circuit board surfaces, whereby N is an integer greater than 2;
        a plurality of radial metal foils on each of 2N of the at least 2N circuit board surfaces, each metal foil extending along an axis that radiates from approximately the center of the opening;
        N windings, each winding formed by electrically connecting metal foils on a respective pair of circuit board surfaces with plated through holes penetrating the circuit board surfaces in a thickness direction of the printed circuit board; wherein a first winding is comprised of metal foils on a board top surface and a board bottom surface;
        N return circuit lines; wherein the return circuit lines are approximately circular metal foils with a center that is approximately the center of the opening; each of the return circuit lines being electrically connected with one of the N windings in series to form N winding—return circuit line pairs;
        wherein the return circuit lines also comprise windings that are wound oppositely to the N windings;
        and wherein the N winding—return circuit line pairs are in turn connected in series with one another.

3. A current transformer, comprising:
    a Rogowski coil, having an opening at the center in which a conductor penetrates, comprising:

a printed circuit board comprising at least N circuit board surfaces, whereby N is at least four;

a plurality of radial metal foils, with at least one foil disposed on each of at least four circuit board surfaces, each metal foil extending along an axis that radiates from approximately the center of the opening;

W windings, where W is at least 2, each winding formed by electrically connecting metal foils on a respective pair of circuit board surfaces with plated through holes penetrating the circuit board surfaces in a thickness direction of the printed circuit board; wherein a first winding is comprised of metal foils on a board top surface and a board bottom surface;

W return circuit lines; wherein the return circuit lines are approximately circular metal foils with a center that is approximately the center of the opening; each of the return circuit lines being electrically connected with one of the W windings in series to form W winding—return circuit line pairs;

wherein the W winding—return circuit line pairs are in turn connected in series with one another.

4. A current transformer, comprising:
a Rogowski coil, having an opening at the center in which a conductor penetrates, comprising:
a printed circuit board comprising at least N circuit board surfaces, whereby N is at least four;
a plurality of radial metal foils on each of four of the circuit board surfaces, each metal foil extending along an axis that radiates from approximately the center of the opening;
W windings, each winding formed by electrically connecting metal foils on a respective pair of circuit board surfaces with plated through holes penetrating the circuit board surfaces in a thickness direction of the printed circuit board; wherein a first winding is comprised of metal foils on a board top surface and a board bottom surface;
W return circuit lines; wherein the return circuit lines are approximately circular metal foils with a center that is approximately the center of the opening; each of the return circuit lines being electrically connected with one of the W windings in series to form W winding—return circuit line pairs;
wherein the return circuit lines also comprise windings that are wound oppositely to the N windings;
and wherein the W winding—return circuit line pairs are in turn connected in series with one another.

5. A current transformer, comprising a Rogowski coil, having an opening at the center in which a conductor penetrates, further comprising:
a printed circuit board comprising at least N circuit board surfaces, whereby N is at least four;
a plurality of radial metal foils with at least one foil disposed on each of at least four circuit board surfaces, each metal foil extending along an axis that radiates from approximately the center of the opening;
W windings, where W is at least 2, each winding formed by electrically connecting metal foils on a respective pair of circuit board surfaces with plated through holes penetrating the circuit board surfaces in a thickness direction of the printed circuit board;
W return circuit lines, wherein the return circuit lines traverse an approximately circular path with a center that is approximately the center of the opening; each of the return circuit lines being electrically connected with one of the windings in series to form W winding—return circuit line pairs;

wherein the W winding—return circuit line pairs are in turn connected in series with one another.

6. The current transformer of claim 5,
wherein the W return circuit lines further comprise W return-circuit windings formed by electrically connecting metal foils on a respective pair of circuit board surfaces with plated through holes penetrating the circuit board surfaces; and
wherein the W return circuit windings are wound oppositely to the W windings.

7. The current transformer of claim 5, wherein the W return circuit lines comprise W approximately circular metal foils disposed on a single board surface.

8. A current transformer, comprising:
a Rogowski coil, having an opening at the center in which a conductor penetrates, comprising:
a printed circuit board having at least first to fourth circuit board surfaces including a circuit board top surface, a circuit board bottom surface and circuit board conducting internal surfaces between the circuit board top surface and the circuit board bottom surface;
a plurality of radial metal foils, each metal foil radiating from a center that is approximately the center of the opening, mounted on the first to fourth circuit board surfaces;
a first winding formed by electrically connecting metal foils on the first and second circuit board surfaces with first plated through holes penetrating the first and second circuit board surfaces in a thickness direction of the printed circuit board;
a second winding formed by electrically connecting metal foils on the third and fourth circuit board surfaces with second plated through holes penetrating the third and fourth circuit board surfaces in a thickness direction of the printed circuit board;
a first return circuit line electrically connected with the first winding in series;
a second return circuit line electrically connected with the second winding in series; and
a pair of the first winding and the first return circuit line and a pair of the second winding and the second return circuit line being electrically connected in series.

9. The current transformer in claim 8, wherein the first return circuit line and the second return circuit line are first and second circular metal foils with a center that is the center of the opening.

10. The current transformer in claim 9, wherein a total number of windings, including the first winding and the second winding, equals a total number of return circuit lines, including the first return circuit line and the second return circuit line, and wherein the first return circuit line and the second return circuit line are formed on the same circuit board surface.

11. The current transformer in claim 9, wherein a total number of windings, including the first winding and the second winding, equals a total number of return circuit lines, including the first return circuit line and the second return circuit line, and the first return circuit line is formed on a fifth circuit board surface of the plurality of layers, and the second return circuit line is formed on a sixth circuit board surface of the plurality of layers.

12. The current transformer of claim 8, wherein the first circuit board surface is the circuit board top surface, the second circuit board surface is a circuit board internal surface, the third circuit board surface is the circuit board bottom surface, and the fourth circuit board surface is a circuit board internal surface.

13. The current transformer of claim 8, wherein the first circuit board surface is the circuit board top surface, the second circuit board surface is the circuit board bottom surface, the third circuit board surface is a circuit board internal surface, and the fourth circuit board surface is a circuit board internal surface.

14. The current transformer in claim 8, wherein the Rogowski coil comprises:
- N windings, including the first and second windings, each formed by electrically connecting the radial metal foils on a respective pair of the circuit board surfaces with plated through holes penetrating the pair of circuit board surfaces in a thickness direction of the printed circuit board, N being an integer greater than one;
- N return circuit lines, including the first and second return circuit lines; each return circuit line being formed on at least one of the circuit board surface; and
- the N windings and the N return circuit lines being electrically connected in series.

15. The current transformer in claim 14, wherein each of the N return circuit lines is a return winding formed by electrically connecting radial metal foils on a respective pair of the circuit board surfaces with plated through holes penetrating the pair of circuit board surfaces in a thickness direction of the printed circuit board, and is wound in a direction opposite to a direction in which the N windings are wound.

16. The current transformer in claim 15, wherein the Rogowski coil further comprises:
- a first multiple winding formed by connecting a first group of the windings to each other in series; and
- a second multiple winding formed by connecting a second group of the return windings to each other in series,
- wherein the first multiple winding and the second multiple winding are connected to each other so that the first multiple winding is a mirror image of the second multiple winding on the printed circuit board.

17. The current transformer in claim 16, wherein the plurality of layers include (4N+2) circuit board surfaces, on each of which the plurality of radial metal foils are formed, N being an integer not smaller than one, and a fifth circuit board surface, and wherein the first return circuit line is a first circular metal foil on the fifth circuit board surface with a center that is approximately the center of the opening, and wherein the Rogowski coil further comprises:
- (N+1) windings, including the first and second windings, each winding being formed by electrically connecting the radial metal foils on a respective pair of the circuit board surfaces with plated through holes penetrating the pair of circuit board surfaces in a thickness direction of the printed circuit board;
- N return circuit lines, including the second return circuit line, each return circuit line being a return winding formed by electrically connecting radial metal foils on a respective pair of the circuit board surfaces with plated through holes penetrating the pair of circuit board surfaces in a thickness direction of the printed circuit board, and being wound in a direction opposite to a direction in which the (N+1) windings are wound; and
- the (N+1) windings, the N return windings, and the first circular metal foil being electrically connected in series.

18. The current transformer as recited in claim 8, wherein the Rogowski coil comprises a plurality of the printed circuit boards, arranged so that corresponding center axis openings of respective printed circuit boards are aligned with each other, and the windings formed on the respective printed circuit boards are connected to each other in series.

19. The current transformer in claim 8, further comprising:
- a sensor unit, comprising,
- an analog-to-digital converter which converts the analog-voltage signal into a digital electric signal, and
- an electric-to-optic converter which converts the digital electric signal into a digital optical signal; and
- an optical transmission unit which transmits the digital optical signal to upstream system.

20. The current transformer in claim 19, wherein a number of the Rogowski coils, a number of the sensor units, and a number of the optical transmission units are each more than one, and the current transformer further comprises:
- a merging unit which merges a plurality of the digital optical signals outputted from the respective Rogowski coils through the respective sensor units to generate at least one merged transmission signal, and transmits the merged transmission signal to the upstream system.

21. The current transformer in claim 20, wherein the merging unit compnses:
- a plurality of optic-to-electric converters, each of which converts the respective digital optical signals into a second digital electric signal;
- a second merging unit which merges the respective second digital electric signals to generate at least one second electrical merged transmission signal; and
- a second electric-to-optic converter which converts the second electrical merged transmission signal into a second digital optical signal.

22. The current transformer in claim 20, wherein the merging unit and the upstream system are connected through a point-to-point transmission channel.

23. The current transformer in claim 21, wherein the merging unit and the upstream system are connected through a local area network.

24. A current transformer, comprising:
- a Rogowski coil, having an opening at the center in which a conductor penetrates, comprising:
- a printed circuit board having a plurality of layers forming at least 2N+1 circuit board surfaces including a circuit board top surface, a circuit board bottom surface and circuit board internal surfaces between the circuit board top surface and the circuit board bottom surface, N being an integer more than one;
- N windings, each formed by electrically connecting the radial metal foils on a respective pair of circuit board surfaces with plated thorough holes penetrating the pair of circuit board surfaces in a thickness direction of the printed circuit board; and
- a return circuit line formed on a circuit board surface, electrically connected with at least one of the N windings in series.

25. The current transformer in claim 24, wherein the return circuit line is a circular metal foil with a center that is approximately the center of the opening.

26. The current transformer in claim 24, wherein the return circuit line is set between two windings, and at least one of the N windings and the return circuit line are electrically connected in series.

27. The current transformer in claim 24, wherein the Rogowski coil further comprises:
- a first multiple winding formed by connecting a first group of windings to each other in series;
- a second multiple winding formed by connecting a second group of windings to each other in series, wherein the first multiple winding and the second multiple winding are connected to each other so that the first multiple winding is a mirror image of the second multiple winding on the printed circuit board.

28. A current transformer, comprising:

a Rogowski coil, having a opening at the center in which a conductor penetrates, comprising:

a printed circuit board having a plurality of layers forming at least 2N board surfaces including a circuit board top surface, a circuit board bottom surface and circuit board internal surfaces between the circuit board top surface and the circuit board bottom surface, N being an integer greater than one; and N windings, each formed by electrically connecting the radial metal foils on a respective pair of circuit board surfaces of with plated through holes penetrating the pair of circuit board surfaces in a thickness direction of the printed circuit board, wherein the N windings are connected in series.

29. The current transformer in claim 28, wherein a first one of the N windings is wound in a direction opposite to a direction in which a second one of the N windings is wound.

30. The current transformer in claim 28, wherein one of the N windings is set between two other ones of the N windings.

31. A current transformer, comprising:

a Rogowski coil, having an opening at the center in which a conductor penetrates, comprising:

a printed circuit board comprising at least 2N circuit board surfaces, whereby N is an integer greater than 2;

a plurality of radial metal foils with at least one foil disposed on each of at least four circuit board surfaces, each metal foil extending along an axis that radiates from approximately the center of the opening;

W windings, where W is at least 2, each winding formed by electrically connecting metal foils on a respective pair of circuit board surfaces with plated through holes penetrating the circuit board surfaces in a thickness direction of the printed circuit board;

W return circuit lines; wherein the return circuit lines are approximately circular metal foils with a center that is approximately the center of the opening; each of the return circuit lines being electrically connected with one of the W windings in series to form W winding—return circuit line pairs;

wherein the return circuit lines also comprise windings that are wound oppositely to the W windings.

32. A current transformer, comprising:

a Rogowski coil, having an opening at the center in which a conductor penetrates, comprising:

a printed circuit board comprising at least 4N circuit board surfaces, whereby N is at least 1;

a plurality of radial metal foils with at least one foil disposed on each of at least four of circuit board surfaces, each metal foil extending along an axis that radiates from approximately the center of the opening;

N windings, each winding formed by electrically connecting metal foils on a respective pair of circuit board surfaces with plated through holes penetrating the circuit board surfaces in a thickness direction of the printed circuit board; wherein Nth windings comprise metal foils on adjacent circuit board surfaces;

N return circuit lines; wherein the return circuit lines are approximately circular metal foils with a center that is approximately the center of the opening; each of the return circuit lines being electrically connected with one of the N windings in series to form N winding—return circuit line pairs;

wherein the return circuit lines also comprise windings that are wound oppositely to the N windings;

and wherein the N winding—return circuit line pairs are in turn connected in series with one another.

* * * * *